US011882360B2

(12) United States Patent
Fujii

(10) Patent No.: US 11,882,360 B2
(45) Date of Patent: Jan. 23, 2024

(54) IMAGING DEVICE, IMAGING OPERATION DEVICE, AND CONTROL METHOD

(71) Applicant: Sony Group Corporation, Tokyo (JP)

(72) Inventor: Kentaro Fujii, Tokyo (JP)

(73) Assignee: Sony Group Corporation, Tokyo (JP)

( * ) Notice: Subject to any disclaimer, the term of this patent is extended or adjusted under 35 U.S.C. 154(b) by 233 days.

(21) Appl. No.: 17/417,138

(22) PCT Filed: Jan. 23, 2020

(86) PCT No.: PCT/JP2020/002219
§ 371 (c)(1),
(2) Date: Jun. 22, 2021

(87) PCT Pub. No.: WO2020/162194
PCT Pub. Date: Aug. 13, 2020

(65) Prior Publication Data
US 2022/0070358 A1    Mar. 3, 2022

(30) Foreign Application Priority Data
Feb. 6, 2019  (JP) .................................. 2019-019558

(51) Int. Cl.
*H04N 23/67* (2023.01)
*G03B 17/02* (2021.01)
(Continued)

(52) U.S. Cl.
CPC ............. *H04N 23/67* (2023.01); *G03B 17/02* (2013.01); *H04N 23/51* (2023.01); *H04N 23/54* (2023.01)

(58) Field of Classification Search
CPC .................................................. H04N 23/67
(Continued)

(56) References Cited

U.S. PATENT DOCUMENTS 3,754,454 A    8/1973 Nakamura et al.
3,878,548 A    4/1975 Ettischer
(Continued)

FOREIGN PATENT DOCUMENTS

JP    56-147138 A    11/1981
JP    4-125621 A     4/1992
(Continued)

OTHER PUBLICATIONS

International Search Report dated Mar. 31, 2020 in PCT/JP2020/002219 filed on Jan. 23, 2020, citing documents AA, AO-AQ, AS and AT therein, 3 pages.

*Primary Examiner* — Joel W Fosselman
(74) *Attorney, Agent, or Firm* — Oblon, McClelland, Maier & Neustadt, L.L.P.

(57) ABSTRACT

The present disclosure relates to an imaging device, an imaging operation device, and a control method that enable better imaging.
A reaction force generating unit generates a reaction force with respect to the operation direction of the operation unit, and a control unit sets the reaction force on the basis of imaging-related information during operation on the operation unit. Further, the operation unit gives an instruction on a start of image capture by the imaging device, a position detection unit detects an amount of operation with respect to the operation direction of the operation unit, and the control unit sets the reaction force according to the amount of operation. The present technology can be applied, for example, to imaging devices such as single-lens reflex cameras and compact cameras.

19 Claims, 27 Drawing Sheets

(51) Int. Cl.
*H04N 23/51* (2023.01)
*H04N 23/54* (2023.01)

(58) Field of Classification Search
USPC .......................................... 348/345
See application file for complete search history.

(56) References Cited

U.S. PATENT DOCUMENTS

| | | | |
|---|---|---|---|
| 9,507,420 B2 | 11/2016 | Tartz et al. | |
| 2005/0123291 A1* | 6/2005 | Robins .................. | G03B 17/38 |
| | | | 396/543 |
| 2011/0102355 A1 | 5/2011 | Aono et al. | |

FOREIGN PATENT DOCUMENTS

| | | | |
|---|---|---|---|
| JP | H05265091 | * | 10/1993 |
| JP | 2000-209467 A | | 7/2000 |
| JP | 2001-215601 A | | 8/2001 |
| JP | 2005-165316 A | | 6/2005 |
| JP | 2014-164172 A | | 9/2014 |

* cited by examiner

FIG. 13

| MEMORY CONDITION | REMAINING CARD CAPACITY IS XX% OR LESS | REACTION FORCE IS INCREASED WHILE IN S2 |
|---|---|---|
| | MAXIMUM NUMBER OF IMAGES TO BE CAPTURED IS XX OR LESS | REACTION FORCE IS INCREASED WHILE IN S2 |
| | REMAINING RECORDING TIME IS XX HOURS OR LESS | REACTION FORCE IS INCREASED WHILE IN S2 |
| | REMAINING TIME FOR CONTINUOUS IMAGE CAPTURE IS 3 SECONDS OR LESS | REACTION FORCE IS INCREASED WHILE IN S2 |

| COMPOSITION CONDITION | EQUAL TO OR GREATER THAN CAMERA SHAKE SETTING LEVEL | REACTION FORCE IS INCREASED WHILE IN S1 |
|---|---|---|
| | OUTSIDE FACE DETECTION POSITION SETTING RANGE | REACTION FORCE IS INCREASED WHILE IN S1 |
| | DEGREE OF LEVELNESS IS 5 DEGREES OR MORE | REACTION FORCE IS INCREASED WHILE IN S1 |

| MODE CONDITION 1 | MOVING IMAGE MODE | REACTION FORCE IS INCREASED WHILE IN S2 |
|---|---|---|
| | CONTINUOUS IMAGE CAPTURE MODE | REACTION FORCE IS DECREASED WHILE IN S1 |
| | ELECTRONIC SHUTTER MODE | MICRO VIBRATION AT S2 |

| MODE CONDITION 2 | MOVING IMAGE MODE | REACTION FORCE IS INCREASED WHILE IN S2 |
|---|---|---|
| | CONTINUOUS IMAGE CAPTURE MODE | REACTION FORCE IS DECREASED WHILE IN S1 |
| | ELECTRONIC SHUTTER MODE | MICRO VIBRATION AT S2 |
| | ERRONEOUS OPERATION PREVENTION MODE | ABNORMAL IN OPERATION SPEED INCREASE REACTION FORCE WHILE DETECTION OF S1/S2 IS OFF |

| AF CONDITION 1 | NOTHING IS FOCUSED | REACTION FORCE IS INCREASED WHILE IN S1 |
|---|---|---|
| | PUPIL DETECTION IS UNSUCCESSFUL | REACTION FORCE IS INCREASED WHILE IN S1 |
| | FACE DETECTION IS UNSUCCESSFUL | REACTION FORCE IS INCREASED WHILE IN S1 |

| AF CONDITION 2 | DEGREE OF FOCUS IS HIGH | REACTION FORCE IS DECREASED WHILE IN S1 |
|---|---|---|
| | DEGREE OF FOCUS IS MEDIUM | INTERMEDIATE REACTION FORCE WHILE IN S1 |
| | DEGREE OF FOCUS IS LOW | REACTION FORCE IS INCREASED WHILE IN S1 |

| BATTERY CONDITION | MAXIMUM NUMBER OF IMAGES TO BE CAPTURED IS XX OR LESS | REACTION FORCE IS INCREASED WHILE IN S2 |
|---|---|---|
| | REMAINING RECORDING TIME IS XX HOURS OR LESS | REACTION FORCE IS INCREASED WHILE IN S2 |
| | REMAINING BATTERY CAPACITY IS 20% OR LESS | REACTION FORCE IS ENTIRELY INCREASED |

# IMAGING DEVICE, IMAGING OPERATION DEVICE, AND CONTROL METHOD

TECHNICAL FIELD

The present disclosure relates to an imaging device, an imaging operation device, and a control method, and more particularly to an imaging device, an imaging operation device, and a control method that enable better imaging.

BACKGROUND ART

Generally, in an imaging device such as a single-lens reflex camera or a compact camera, various icon images for giving information such as an operating mode or an operation status are displayed on a display unit for displaying a captured image or a reproduced image. A user can capture an image with the imaging device while recognizing, for example, the remaining battery capacity, an imaging size, and an imaging mode with these icon images.

In addition, an imaging device has also been proposed that notifies the user of an operating mode, an operation status, and the like by a notification method other than displaying an icon image on a display unit.

For example, Patent Document 1 discloses a technology with which it is possible for a user to point an imaging device in a desired direction without seeing a guidance display in a finder or a display unit by notification by a stimulus generation device that generates an output for stimulating the user's skin sensation.

CITATION LIST

Patent Document

Patent Document 1: Japanese Patent Application Laid-Open No. 2014-164172

SUMMARY OF THE INVENTION

Problems to be Solved by the Invention

However, the imaging device disclosed in Patent Document 1 described above may cause erroneous operation or camera shake due to stimulation of the user's skin sensation, and as a result, it is presumed that it may not be possible to capture a good image.

The present disclosure has been made in view of the above circumstance, and is intended to enable better imaging.

Solutions to Problems

An imaging device according to one aspect of the present disclosure includes: an operation unit; a reaction force generating unit that generates a reaction force with respect to an operation direction of the operation unit; and a control unit that sets the reaction force on the basis of imaging-related information during operation on the operation unit.

An imaging operation device according to one aspect of the present disclosure includes: a communication unit that communicates with an imaging device by wire or wirelessly; an operation unit that controls an imaging operation of the imaging device via the communication unit; a reaction force generating unit that generates a reaction force with respect to an operation direction of the operation unit; and a control unit that sets the reaction force on the basis of imaging-related information of the imaging device during operation on the operation unit.

A control method according to one aspect of the present disclosure includes: generating a reaction force with respect to an operation direction of an operation unit; and setting the reaction force on the basis of imaging-related information during operation on the operation unit.

In one aspect of the present disclosure, a reaction force with respect to the operation direction of the operation unit is generated, and the reaction force is set on the basis of imaging-related information during operation on the operation unit.

BRIEF DESCRIPTION OF DRAWINGS

FIG. 13 is a diagram showing a setting example of a profile.

MODE FOR CARRYING OUT THE INVENTION

Specific embodiments to which the present technology is applied will be described below in detail with reference to the drawings.

<Configuration Example of Imaging Device>

Figure 1:
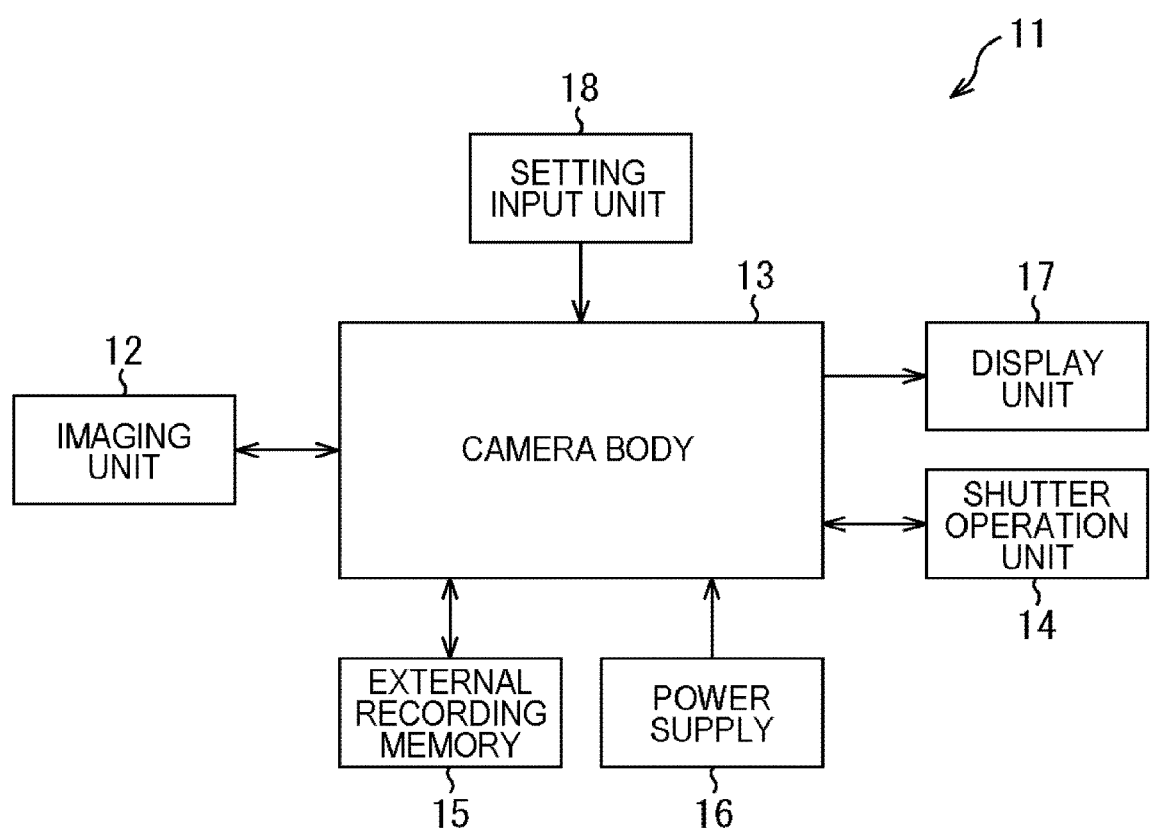
FIG. 1 is a block diagram showing a configuration example of an imaging device to which the present technology is applied according to an embodiment.

FIG. 1 is a block diagram showing a configuration example of an imaging device to which the present technology is applied according to an embodiment.

As shown in FIG. 1, an imaging device 11 includes an imaging unit 12, a camera body 13, a shutter operation unit 14, an external storage memory 15, a power supply 16, a display unit 17, and a setting input unit 18.

The imaging unit 12 captures and acquires an image of a subject (not shown) at the timing at which a user performs shutter operation on the shutter operation unit 14 according to optical system control and shutter control from the camera body 13, and supplies the acquired image to the camera body 13. For example, the imaging unit 12 includes an optical system 61 and an imaging element 62, as will be described later with reference to FIG. 12.

The camera body 13 is driven by electric power supplied from the power supply 16, controls the image capture by the imaging unit 12 in response to the user's shutter operation on the shutter operation unit 14, and stores the image obtained by the image capture in the external storage memory 15 or displays the image on the display unit 17. Further, in the camera body 13, reaction force control processing is performed for controlling a reaction force generated in the shutter operation unit 14 with respect to a force for pushing a release cover 22 (see FIG. 2) of the shutter operation unit 14 when the user performs the shutter operation. Note that the detailed configuration of the camera body 13 will be described later with reference to FIG. 12.

When, for example, the shutter operation for pushing the release cover 22 is performed by the user for capturing an image by the imaging device 11, the shutter operation unit 14 supplies a shutter operation signal according to the shutter operation to the camera body 13. Note that the shutter operation unit 14 may be incorporated in the imaging device 11, or may be a device independent of the imaging device 11. For example, the shutter operation unit 14 may have a structure of transmitting a shutter operation signal by wired or wireless communication with the camera body 13 (that is, may have a structure provided with a communication unit that performs such communication).

For example, the shutter operation unit 14 includes a stroke detection structure (see FIGS. 7 to 11 described later) that detects a stroke position according to an amount of pushing the release cover 22 by the user during the shutter operation. Further, the shutter operation unit 14 is provided with a reaction force generating structure (see FIGS. 2 to 6 described later) that generates a reaction force directed to a direction opposite to the direction in which the release cover 22 is pushed by the user by a current or voltage supplied in response to the execution of the reaction force control processing by the camera body 13. Note that the reaction force to be generated in the shutter operation unit 14 is preferably directed to only one specific direction.

The external storage memory 15 is detachably mounted to the camera body 13, for example, and stores an image supplied from the camera body 13 while being mounted to the camera body 13.

The power supply 16 is detachably mounted to the camera body 13, for example, and supplies electric power required for driving to the camera body 13 while being mounted to the camera body 13.

The display unit 17 displays an image supplied from the camera body 13, for example, an image captured in real time by the imaging unit 12, an image read from the external storage memory 15 and reproduced, or the like.

The setting input unit 18 includes, for example, a button or a touch panel, and is used when the user inputs various kinds of setting information required for image capture by the imaging device 11, for example, setting information registered in a profile as shown in FIG. 13 to be described later.

The imaging device 11 configured as described above can control the reaction force generated in the shutter operation unit 14 on the basis of the stroke position detected by the shutter operation unit 14 when the user performs image capture. Then, the imaging device 11 can notify the user of information that affects the acquisition of image by the reaction force generated in the shutter operation unit 14, for example, the remaining time for continuous image capture, the degree of levelness, or the like which will be described later, and thus, the user can perform better imaging.

<Configuration Example of Shutter Operation Unit>

A reaction force generating structure and a stroke detection structure of the shutter operation unit 14 will be described with reference to FIGS. 2 to 11.

Figure 2:
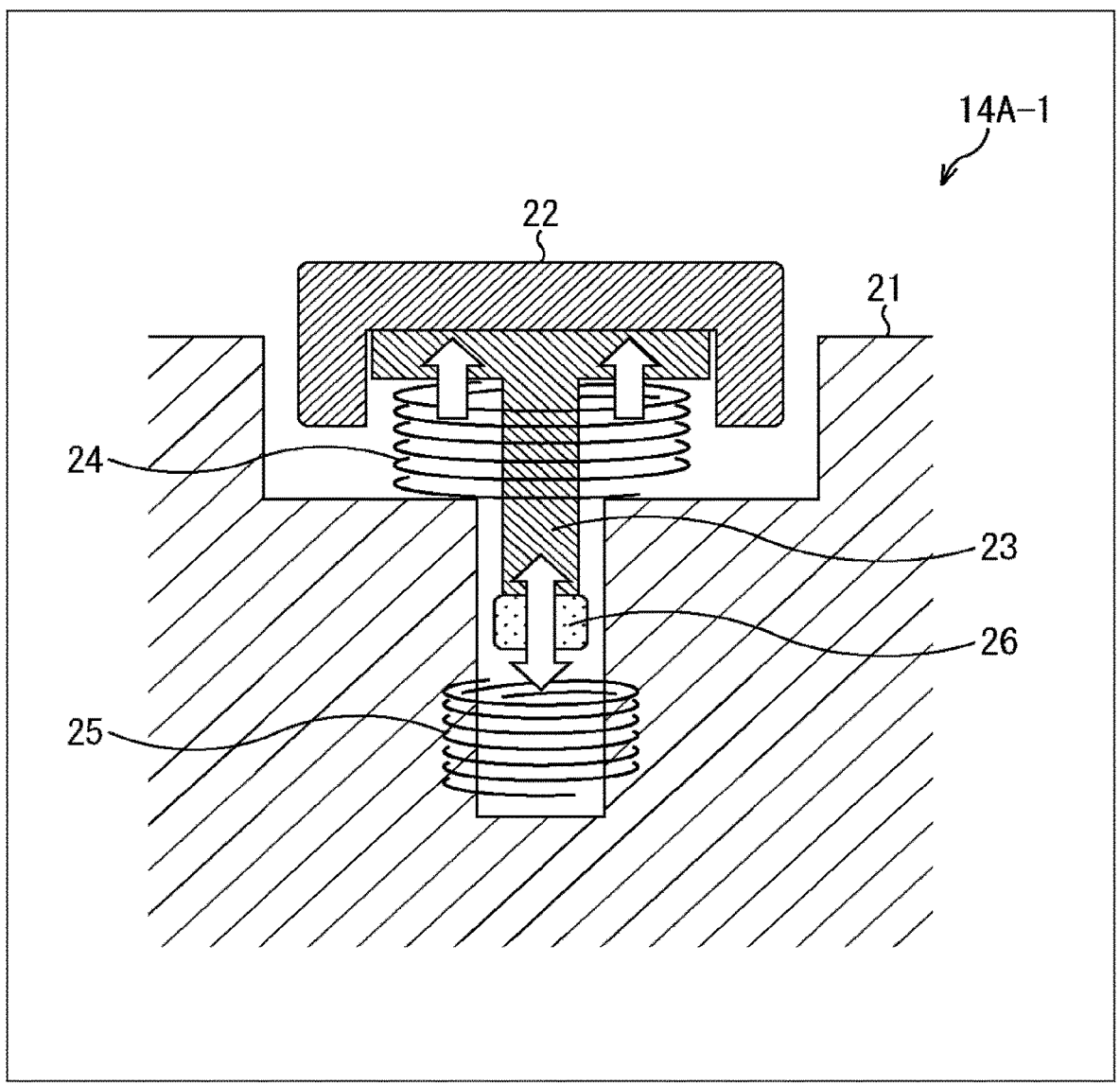
FIG. 2 is a view showing a first structural example for describing a reaction force generating structure.

FIG. 2 shows a schematic cross-sectional view showing a first structural example for describing the reaction force generating structure employed in the shutter operation unit 14.

As shown in FIG. 2, a shutter operation unit 14A-1 is incorporated in a housing 21 of the camera body 13, and includes a release cover 22, a release shaft 23, a compression coil spring 24, a coil 25, and a magnet 26.

The release cover 22 constitutes the appearance of the shutter operation unit 14A-1, and the release shaft 23 guides the movement of the shutter operation unit 14A-1 along a stroke direction (vertical direction in FIG. 2). Further, the release cover 22 and the release shaft 23 are fixed so as to be integrated, for example.

The compression coil spring 24 urges the release cover 22 and the release shaft 23 in the direction (the direction indicated by upward white arrow in FIG. 2) opposite to the direction in which the release cover 22 is pushed by the user during shutter operation. Further, the compression coil spring 24 always generates a constant spring force that repels the force for pushing the release cover 22 even when no current is supplied to the coil 25.

The coil 25 is formed by winding a metal wire along the stroke direction of the shutter operation unit 14A-1 so that the release shaft 23 serves as the central axis, and is fixed to the housing 21 so as to be located in the vicinity of the magnet 26.

The magnet 26 is fixed to the lower end of the release shaft 23, and the relative positional relationship with respect to the coil 25 varies as the release cover 22 is pushed.

As described above, in the shutter operation unit 14A-1, the reaction force generating structure is constituted by the coil 25 and the magnet 26. That is, by passing an electric current through the coil 25, an electromagnetic force is generated between the coil 25 and the magnet 26 along the stroke direction (direction indicated by double-headed white arrow in FIG. 2) of the shutter operation unit 14A-1. Thus, the shutter operation unit 14A-1 can vary the reaction force with respect to the force for pushing the release cover 22 when the user performs the shutter operation.

For example, in a case where an upward electromagnetic force (repulsive force) in FIG. 2 is generated by the coil 25 and the magnet 26, a reaction force obtained by combining the electromagnetic force and the spring force of the compression coil spring 24 is transmitted to the user who is pushing the release cover 22. Note that a downward electromagnetic force (attractive force) in FIG. 2 can be generated by the coil 25 and the magnet 26, and in a case where an electromagnetic force balanced with the spring force of the compression coil spring 24 is generated due to such electromagnetic force, the reaction force is 0. Further, the coil 25 and the magnet 26 can generate a force that pulls the release cover 22 downward in FIG. 2.

Figure 3:
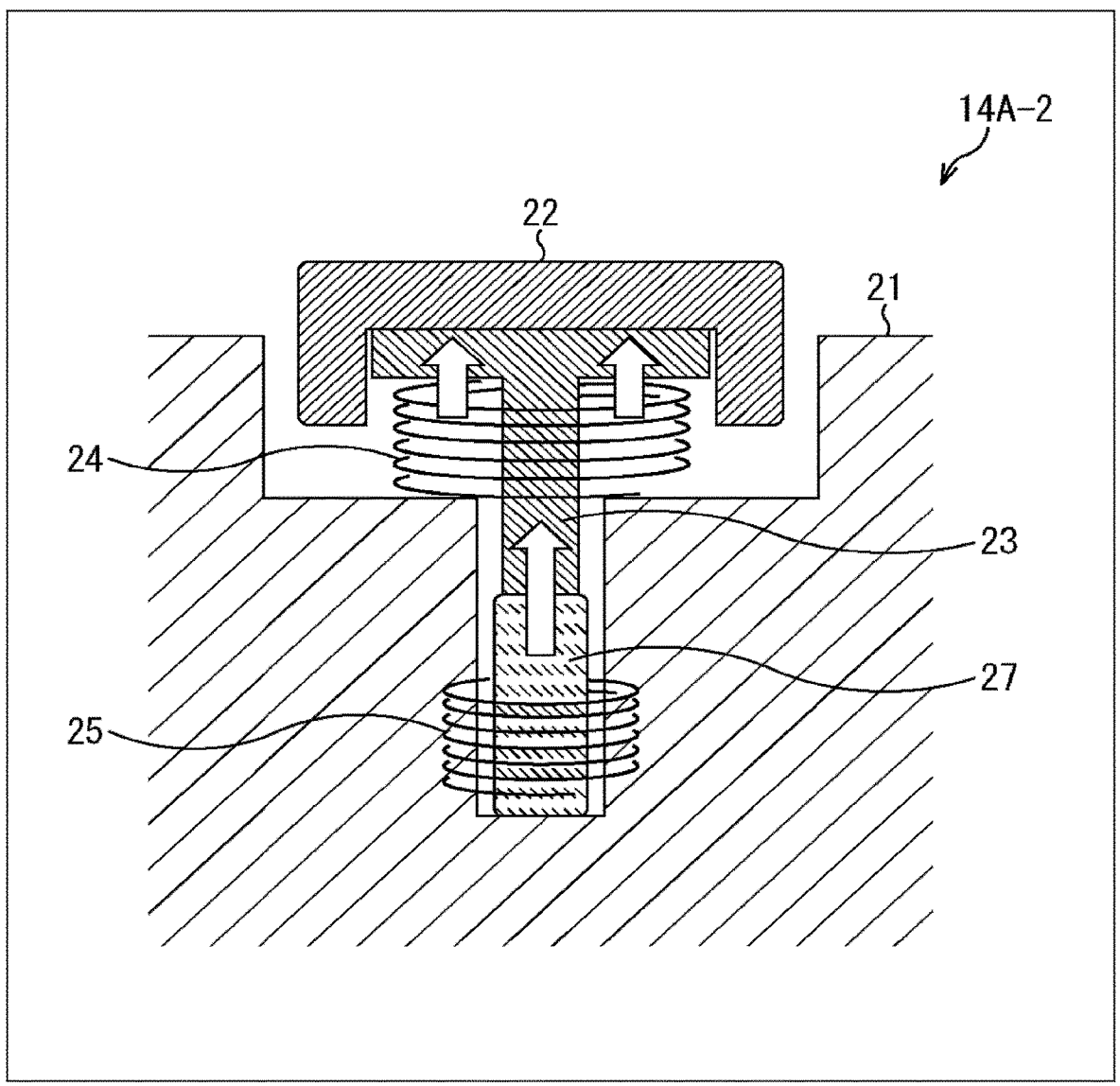
FIG. 3 is a view showing a second structural example for describing the reaction force generating structure.

FIG. 3 shows a schematic cross-sectional view showing a second structural example for describing the reaction force generating structure employed in the shutter operation unit 14. Note that, in a shutter operation unit 14A-2, the components same as those in the shutter operation unit 14A-1 in FIG. 2 are identified by the same reference numerals, and the detailed description thereof will be omitted.

As shown in FIG. 3, the shutter operation unit 14A-2 is incorporated in the housing 21 of the camera body 13, and includes a release cover 22, a release shaft 23, a compression coil spring 24, and a coil 25, and this configuration is common to the shutter operation unit 14A-1 in FIG. 2.

Then, the shutter operation unit 14A-2 is different from the shutter operation unit 14A-1 in FIG. 2 in that a magnetically variable elastic body 27 is provided between the lower end of the release shaft 23 and the housing 21 of the camera body 13.

The magnetically variable elastic body 27 is an elastic body capable of changing its elastic properties in response to an external magnetic field, and has a structure in which, for example, magnetic particles are dispersed and fixed inside an elastic substance such as an elastomer. Further, as illustrated, the magnetically variable elastic body 27 is disposed so as to pass through the coil 25 with one end in contact with the lower end of the release shaft 23 and the other end in contact with the housing 21 of the camera body 13.

As described above, in the shutter operation unit 14A-2, the reaction force generating structure is constituted by the coil 25 and the magnetically variable elastic body 27. That is, due to a magnetic field generated by passing an electric current through the coil 25, the elastic modulus of the magnetically variable elastic body 27 varies, and a stress directed in a direction (direction indicated by upward white arrow in FIG. 3) in which the release shaft 23 is pushed up by the magnetically variable elastic body 27 is generated. Thus, the shutter operation unit 14A-2 can vary the reaction force with respect to the force for pushing the release cover 22 when the user performs the shutter operation.

For example, in a case where upward stress in FIG. 3 is generated by the coil 25 and the magnetically variable elastic body 27, a reaction force obtained by combining the stress and the spring force of the compression coil spring 24 is transmitted to the user who is pushing the release cover 22. Note that the magnetically variable elastic body 27 cannot generate a downward force in FIG. 3, that is, it cannot set the reaction force to 0 or pull the release cover 22 downward in FIG. 3.

Figure 4:
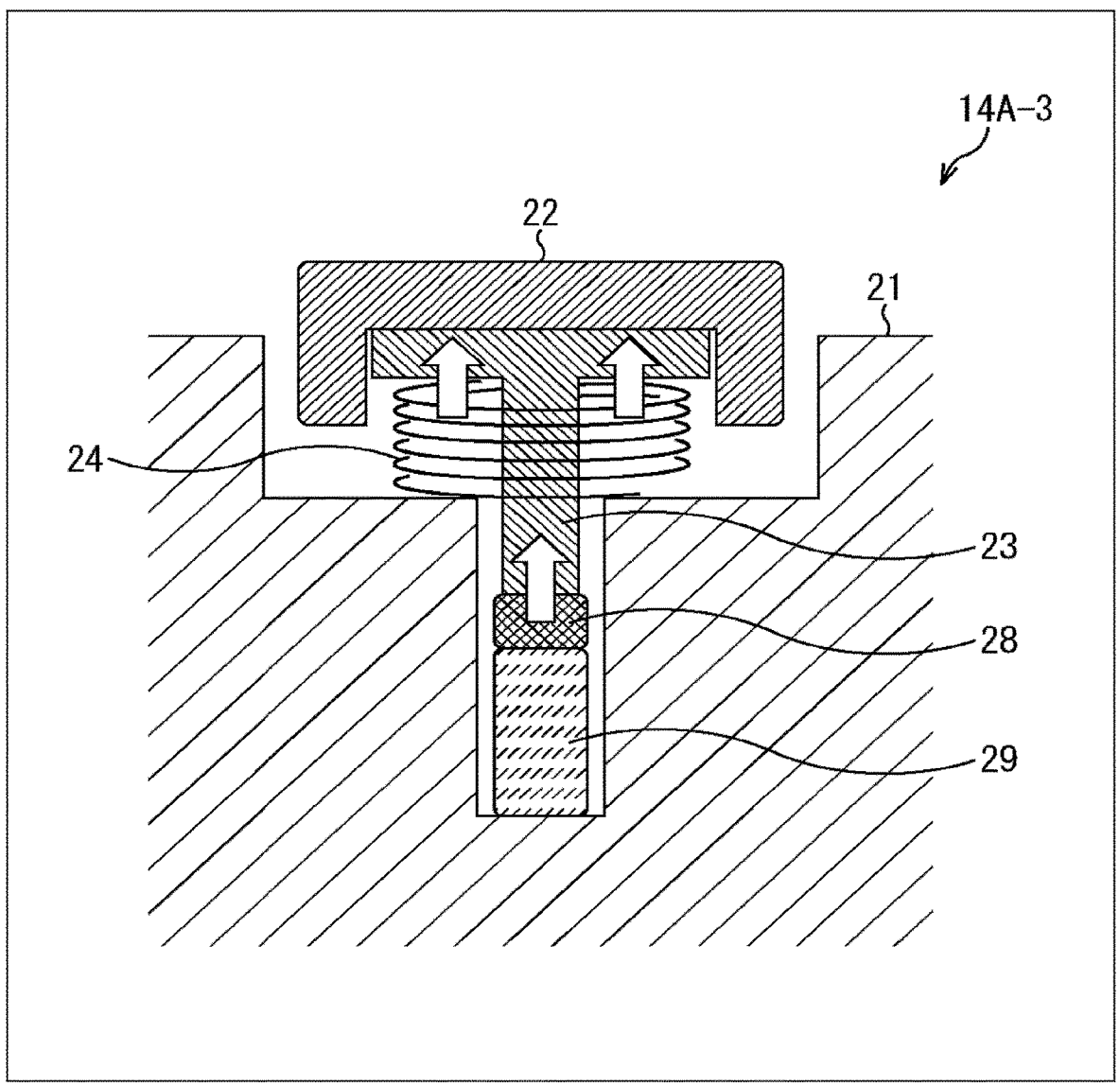
FIG. 4 is a view showing a third structural example for describing the reaction force generating structure.

FIG. 4 shows a schematic cross-sectional view showing a third structural example for describing the reaction force generating structure employed in the shutter operation unit 14. Note that, in a shutter operation unit 14A-3, the components same as those in the shutter operation unit 14A-1 in FIG. 2 are identified by the same reference numerals, and the detailed description thereof will be omitted.

As shown in FIG. 4, the shutter operation unit 14A-3 is incorporated in the housing 21 of the camera body 13, and includes a release cover 22, a release shaft 23, and a compression coil spring 24, and this configuration is common to the shutter operation unit 14A-1 in FIG. 2.

Then, the shutter operation unit 14A-3 is different from the shutter operation unit 14A-1 in FIG. 2 in that a piezoelectric element 28 and an elastic body 29 are provided between the lower end of the release shaft 23 and the housing 21 of the camera body 13. For example, the piezoelectric element 28 and the elastic body 29 are fixed so as to be integrated with each other.

The piezoelectric element 28 generates a stress that spreads toward both ends according to a voltage applied to both ends. Further, the piezoelectric element 28 is disposed so that one end abuts on the lower end of the release shaft 23 and the other end abuts on the elastic body 29.

The elastic body 29 urges the piezoelectric element 28 in the direction (the direction indicated by upward white arrow in FIG. 4) opposite to the direction in which the release cover 22 is pushed by the user during shutter operation. Further, the elastic body 29 is disposed so that one end abuts on the lower end of the piezoelectric element 28 and the other end abuts on the housing 21 of the camera body 13.

As described above, in the shutter operation unit 14A-3, the reaction force generating structure is constituted by the piezoelectric element 28 and the elastic body 29. That is, by applying a voltage to the piezoelectric element 28, stress is generated in the piezoelectric element 28, and stress in the direction (direction indicated by upward white arrow in FIG. 4) in which the release shaft 23 is pushed up is generated by the piezoelectric element 28. Thus, the shutter operation unit 14A-3 can vary the reaction force with respect to the force for pushing the release cover 22 when the user performs the shutter operation.

For example, in a case where an upward stress in FIG. 4 is generated by the piezoelectric element 28 and the elastic body 29, a reaction force obtained by combining the stress and the spring force of the compression coil spring 24 is transmitted to the user who is pushing the release cover 22. Note that the piezoelectric element 28 cannot generate a downward stress in FIG. 4, that is, it cannot set the reaction force to 0 or pull the release cover 22 downward in FIG. 4.

Further, in the shutter operation unit 14A-3, micro vibration can be generated by applying an AC voltage to the piezoelectric element 28, and a variation in a reaction force having a small amplitude due to the micro vibration can be transmitted to the release cover 22 via the release shaft 23. Thus, the shutter operation unit 14A-3 can cause a tactile change on the finger of the user who is pushing the release cover 22.

Figure 5:
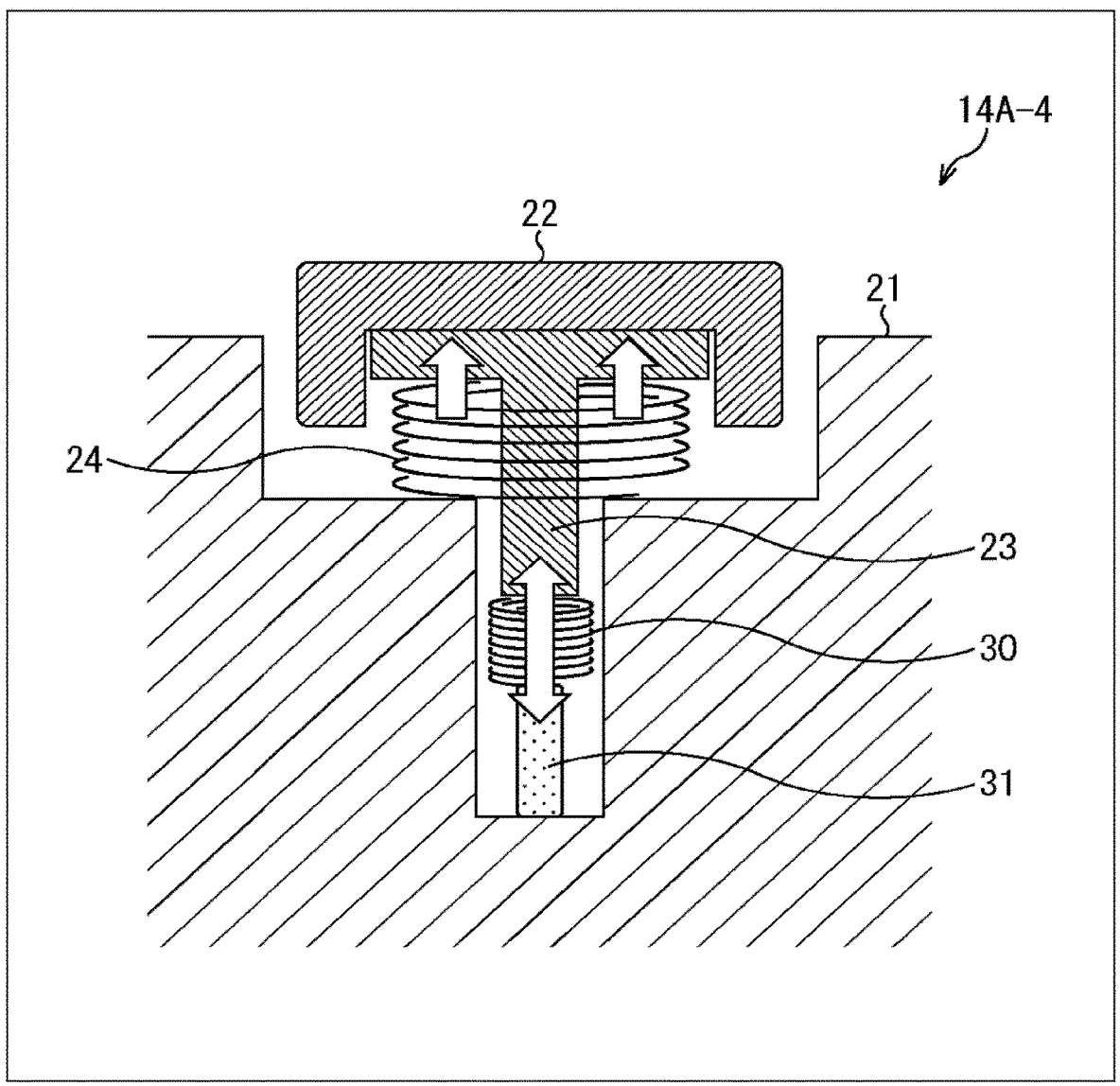
FIG. 5 is a view showing a fourth structural example for describing the reaction force generating structure.

FIG. 5 shows a schematic cross-sectional view showing a fourth structural example for describing the reaction force generating structure employed in the shutter operation unit 14. Note that, in a shutter operation unit 14A-4, the components same as those in the shutter operation unit 14A-1 in FIG. 2 are identified by the same reference numerals, and the detailed description thereof will be omitted.

As shown in FIG. 5, the shutter operation unit 14A-4 is incorporated in the housing 21 of the camera body 13, and includes a release cover 22, a release shaft 23, and a compression coil spring 24, and this configuration is common to the shutter operation unit 14A-1 in FIG. 2.

Then, the shutter operation unit 14A-4 is different from the shutter operation unit 14A-1 in FIG. 2 in that a coil 30 and a magnet 31 are provided between the lower end of the release shaft 23 and the housing 21 of the camera body 13.

The coil 30 is formed by winding a metal wire along a stroke direction of the shutter operation unit 14A-4 so that the release shaft 23 serves as the central axis. Further, the coil 30 is fixed to the lower end of the release shaft 23, and the relative positional relationship with respect to the magnet 31 varies as the release cover 22 is pushed.

The magnet 31 is fixed to the housing 21 of the camera body 13. Further, in a case where the magnet 31 is inserted into the coil 30 so as to pass through the center of the coil 30, the coil 30 moves in the stroke direction so as to surround the magnet 31, by which electromagnetic force can be generated efficiently.

As described above, in the shutter operation unit 14A-4, the reaction force generating structure is constituted by the coil 30 and the magnet 31. Here, in the shutter operation unit 14A-1 in FIG. 2, the coil 25 is fixed to the housing 21 and the magnet 26 is fixed to the release shaft 23, whereas in the shutter operation unit 14A-4, the coil 30 is fixed to the release shaft 23 and fixed to the magnet 31, that is, their positional relationship is reversed.

In the shutter operation unit 14A-4 configured as described above, an electromagnetic force along the stroke direction (direction indicated by double-headed white arrow in FIG. 5) of the shutter operation unit 14A-4 is generated between the coil 30 and the magnet 31, as in the shutter operation unit 14A-1 in FIG. 2. Thus, the shutter operation unit 14A-4 can vary the reaction force with respect to the force for pushing the release cover 22 when the user performs the shutter operation.

Figure 6:
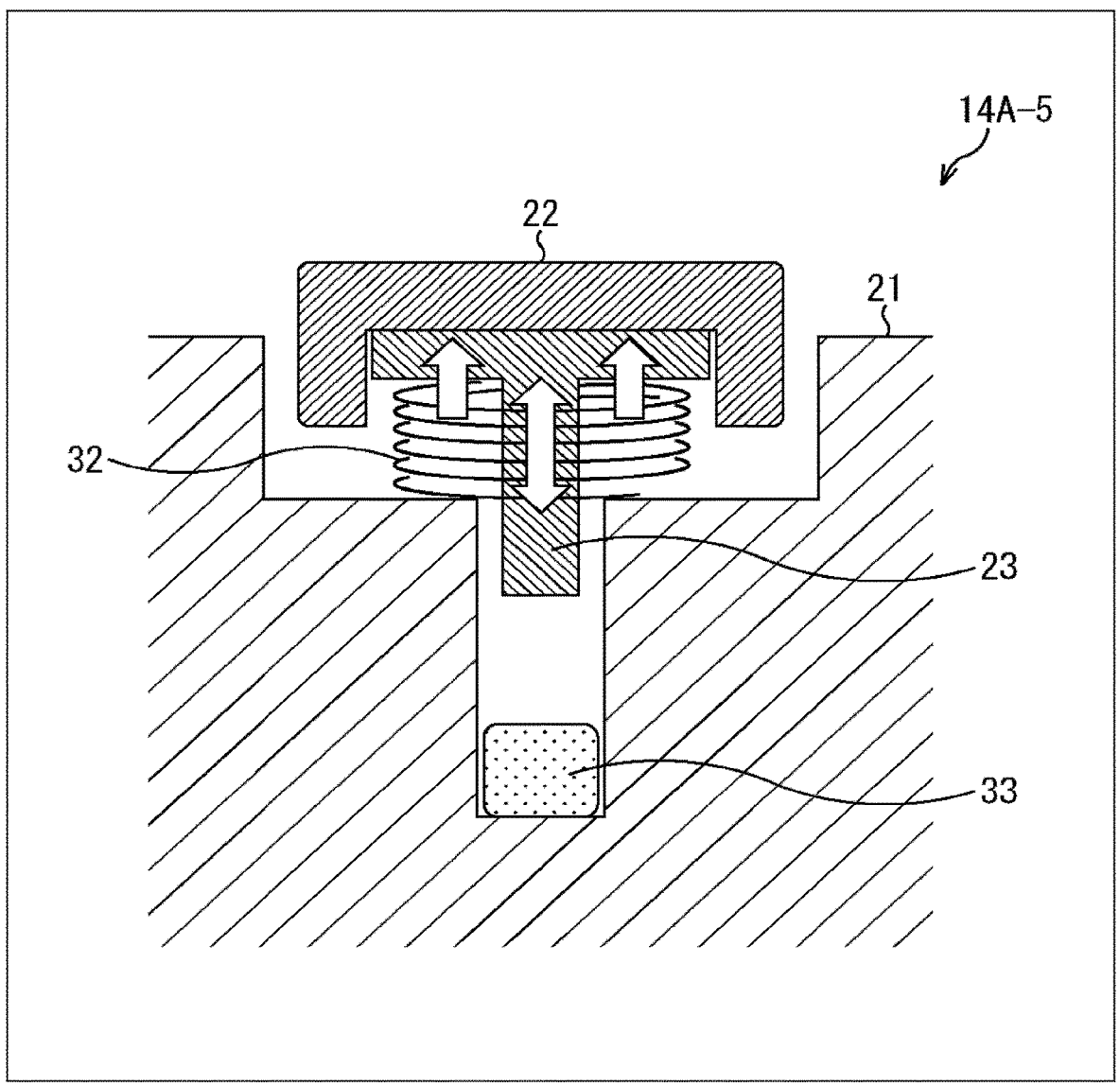
FIG. 6 is a view showing a fifth structural example for describing the reaction force generating structure.

FIG. 6 shows a schematic cross-sectional view showing a fifth structural example for describing the reaction force generating structure employed in the shutter operation unit 14. Note that, in a shutter operation unit 14A-5, the components same as those in the shutter operation unit 14A-1 in FIG. 2 are identified by the same reference numerals, and the detailed description thereof will be omitted.

As shown in FIG. 6, the shutter operation unit 14A-5 is incorporated in the housing 21 of the camera body 13, and includes a release cover 22 and a release shaft 23, and this configuration is common to the shutter operation unit 14A-1 in FIG. 2.

Then, the shutter operation unit 14A-5 is different from the shutter operation unit 14A-1 in FIG. 2 in that it is provided with a magnet 33 and a compression coil spring 32 instead of the compression coil spring 24 in FIG. 2.

Similarly to the compression coil spring 24 in FIG. 2, the compression coil spring 32 urges the release cover 22 and the release shaft 23, and has a similar function to the coil 25 in FIG. 2. That is, by passing an electric current, the compression coil spring 32 can generate an electromagnetic force between the compression coil spring 32 and the magnet 33 along a stroke direction (direction indicated by double-headed white arrow in FIG. 6) of the shutter operation unit 14A-5.

The magnet 33 is fixed to the housing 21 of the camera body 13. Note that the magnet 33 may be inserted into the compression coil spring 32 so as to pass through the center of the compression coil spring 32.

As described above, in the shutter operation unit 14A-5, the reaction force generating structure is constituted by the compression coil spring 32 and the magnet 33. Thus, the shutter operation unit 14A-5 can vary the reaction force with respect to the force for pushing the release cover 22 when the user performs the shutter operation.

Figure 7:
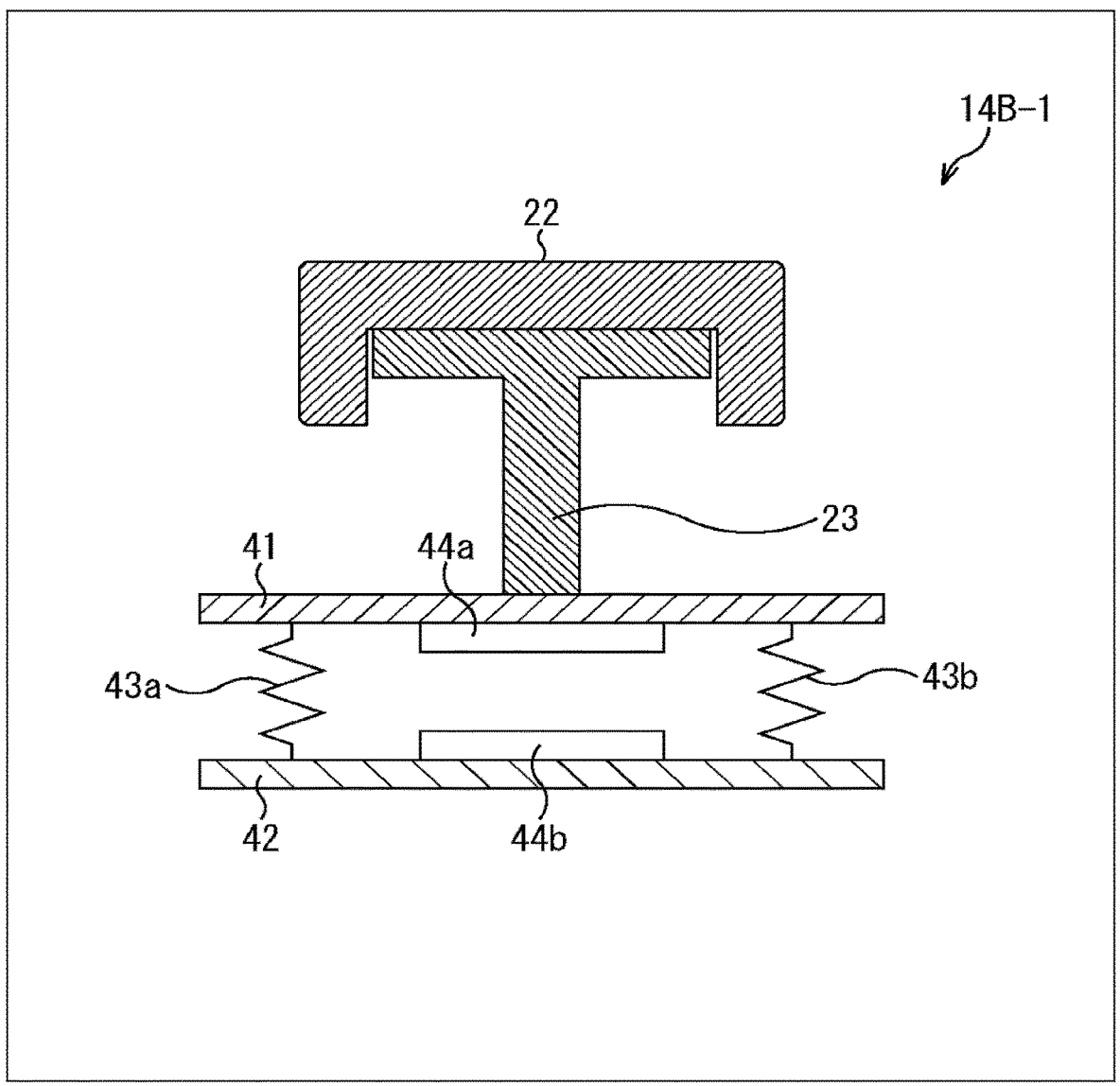
FIG. 7 is a view showing a first structural example for describing a stroke detection structure.

FIG. 7 shows a schematic cross-sectional view showing a first structural example for describing a stroke detection structure employed in the shutter operation unit 14.

As shown in FIG. 7, a shutter operation unit 14B-1 includes a release cover 22, a release shaft 23, a detection plate 41, a detection substrate 42, elastic bodies 43a and 43b, and detection electrodes 44a and 44b.

The release cover 22 and the release shaft 23 are configured in a similar manner to those in the reaction force generating structure described above, and are configured to move along a stroke direction. Then, the release cover 22 and the release shaft 23 are disposed so that the lower end of the release shaft 23 is in contact with the detection plate 41 in a state where the release cover 22 is not pushed.

The detection plate 41 is a plate-shaped member which varies in position with the stroke of the release cover 22 and the release shaft 23 in response to the operation of pushing the release cover 22 by the user during the shutter operation.

The detection substrate 42 includes an electronic circuit that detects a variation in capacitance of the detection electrodes 44a and 44b, and outputs the variation in capacitance as a shutter operation signal for detecting a shutter operation by the user. Further, the detection substrate 42 is fixed to the housing 21 (see FIG. 2) of the camera body 13 (not shown).

The elastic bodies 43a and 43b are, for example, elastic springs, and are provided between the detection plate 41 and the detection substrate 42. For example, the elastic bodies 43a and 43b urge the detection plate 41 upward in FIG. 7.

The detection electrode 44a is fixed to the detection plate 41 on the detection substrate 42 side, and the detection electrode 44b is mounted on the detection substrate 42 on the detection plate 41 side. In this way, the detection electrodes 44a and 44b are disposed so as to face each other, and the distance between the detection electrodes 44a and 44b varies as the release cover 22 is pushed by the user. Thus, the capacitances of the detection electrodes 44a and 44b vary.

As described above, in the shutter operation unit 14B-1, the stroke detection structure is constituted by utilizing a variation in capacitance of the detection electrodes 44a and 44b. That is, the capacitances of the detection electrodes 44a and 44b vary when the release cover 22 is pushed, and the stroke position is detected according to the shutter operation signal corresponding to an amount of the variation.

Figure 8:
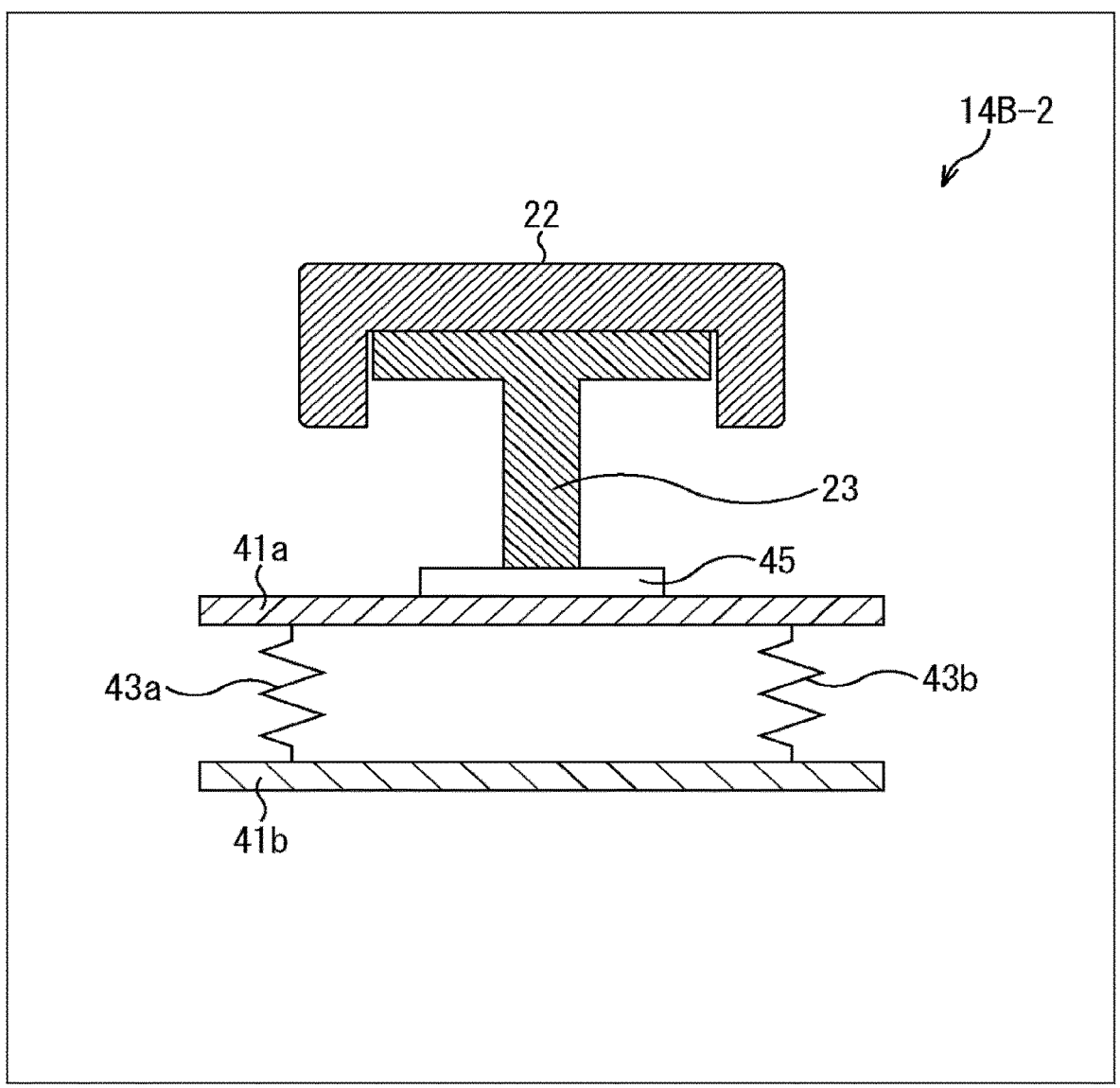
FIG. 8 is a view showing a second structural example for describing the stroke detection structure.

FIG. 8 shows a schematic cross-sectional view showing a second structural example for describing the stroke detection structure employed in the shutter operation unit 14. Note that, in a shutter operation unit 14B-2, the components same as those in the shutter operation unit 14B-1 in FIG. 7 are identified by the same reference numerals, and the detailed description thereof will be omitted.

As shown in FIG. 8, the shutter operation unit 14B-2 includes a release cover 22, a release shaft 23, and elastic bodies 43a and 43b, and this configuration is common to the shutter operation unit 14B-1 in FIG. 7.

Then, the shutter operation unit 14B-2 is different from the shutter operation unit 14B-1 in FIG. 7 in that it is provided with detection plates 41a and 41b and a pressure sensor 45.

Similarly to the detection plate 41 in FIG. 7, the detection plate 41*a* is a plate-shaped member which varies in position with the stroke of the release cover 22 and the release shaft 23 in response to the operation of pushing the release cover 22 by the user during the shutter operation. Further, similarly to the detection plate 41*a*, the detection plate 41*b* is a plate-shaped member and fixed to the housing 21 (see FIG. 2) of the camera body 13 (not shown).

The pressure sensor 45 is fixed to the detection plate 41*a* so as to be located between the lower end of the release shaft 23 and the detection plate 41*a*. Then, the pressure sensor 45 detects pressure (for example, repulsive force of spring) generated in the elastic bodies 43*a* and 43*b* in response to the release cover 22 being pushed by the user during the shutter operation, and outputs a variation in the reaction force as a shutter operation signal for detecting the shutter operation by the user.

As described above, in the shutter operation unit 14B-2, the stroke detection structure is constituted by utilizing a variation in pressure of the elastic bodies 43*a* and 43*b* detected by the pressure sensor 45. That is, the pressure detected by the pressure sensor 45 varies when the release cover 22 is pushed, and the stroke position is detected according to the shutter operation signal corresponding to an amount of the variation.

Figure 9:
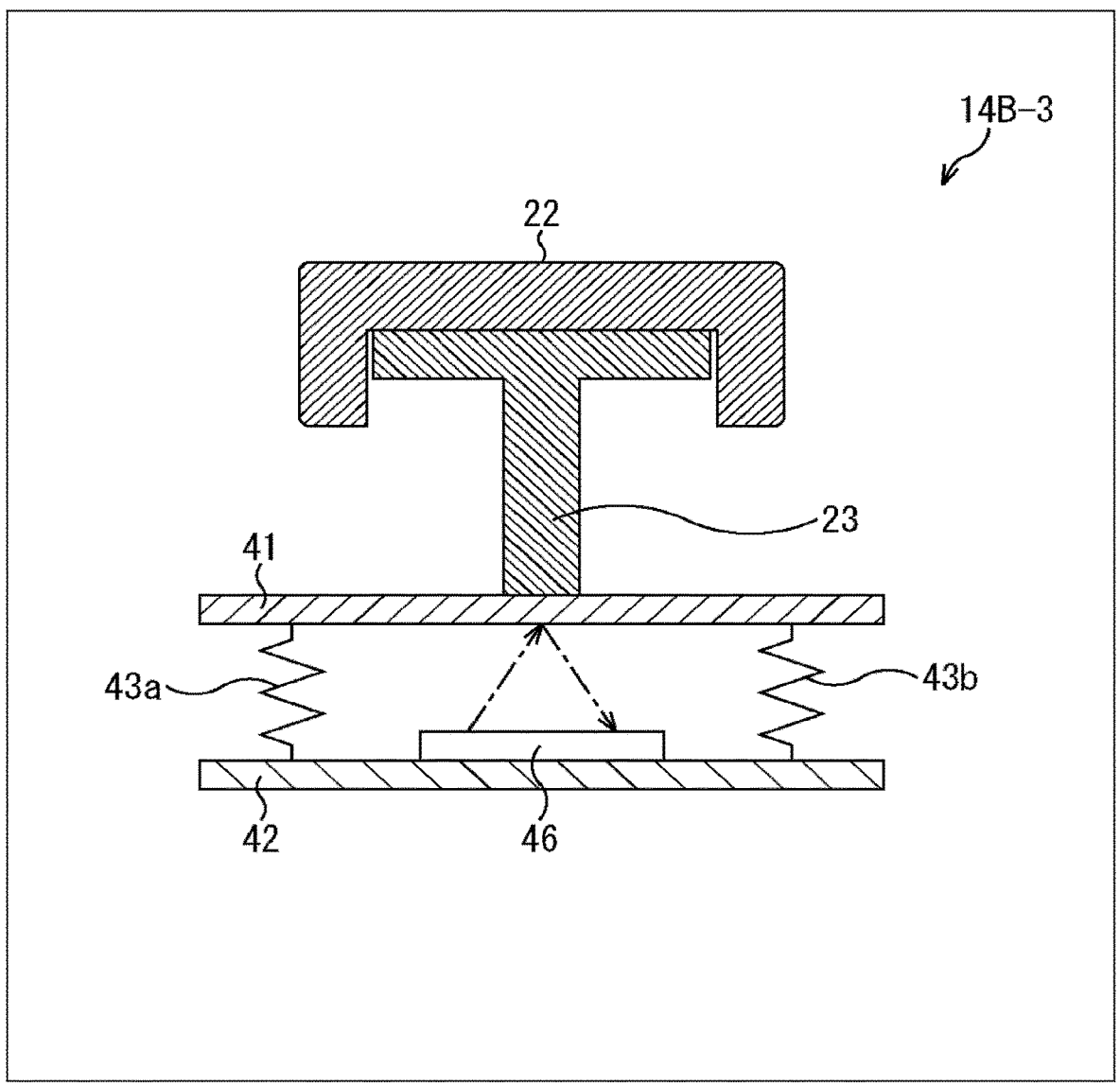
FIG. 9 is a view showing a third structural example for describing the stroke detection structure.

FIG. 9 shows a schematic cross-sectional view showing a third structural example for describing the stroke detection structure employed in the shutter operation unit 14. Note that, in a shutter operation unit 14B-3, the components same as those in the shutter operation unit 14B-1 in FIG. 7 are identified by the same reference numerals, and the detailed description thereof will be omitted.

As shown in FIG. 9, the shutter operation unit 14B-3 includes a release cover 22, a release shaft 23, a detection plate 41, a detection substrate 42, and elastic bodies 43*a* and 43*b*, and this configuration is common to the shutter operation unit 14B-1 in FIG. 7.

Then, the shutter operation unit 14B-3 is different from the shutter operation unit 14B-1 in FIG. 7 in that it is provided with a photo reflector 46.

The photo reflector 46 is mounted on the detection substrate 42 on the detection plate 41 side and emits light toward the detection plate 41. The surface of the detection plate 41 facing the detection substrate 42 is a reflector having light reflectivity, and the photo reflector 46 detects light reflected by the detection plate 41. Thus, when the distance between the detection plate 41 and the detection substrate 42 varies in response to the release cover 22 being pushed by the user, the photo reflector 46 detects the variation in distance and outputs the variation as a shutter operation signal for detecting the shutter operation performed by the user.

As described above, in the shutter operation unit 14B-3, the stroke detection structure is constituted by utilizing a variation in distance detected by the photo reflector 46. That is, when the release cover 22 is pushed, reflected light to be detected by the photo reflector 46 varies, and a stroke position is detected according to the shutter operation signal corresponding to an amount of the variation.

Figure 10:
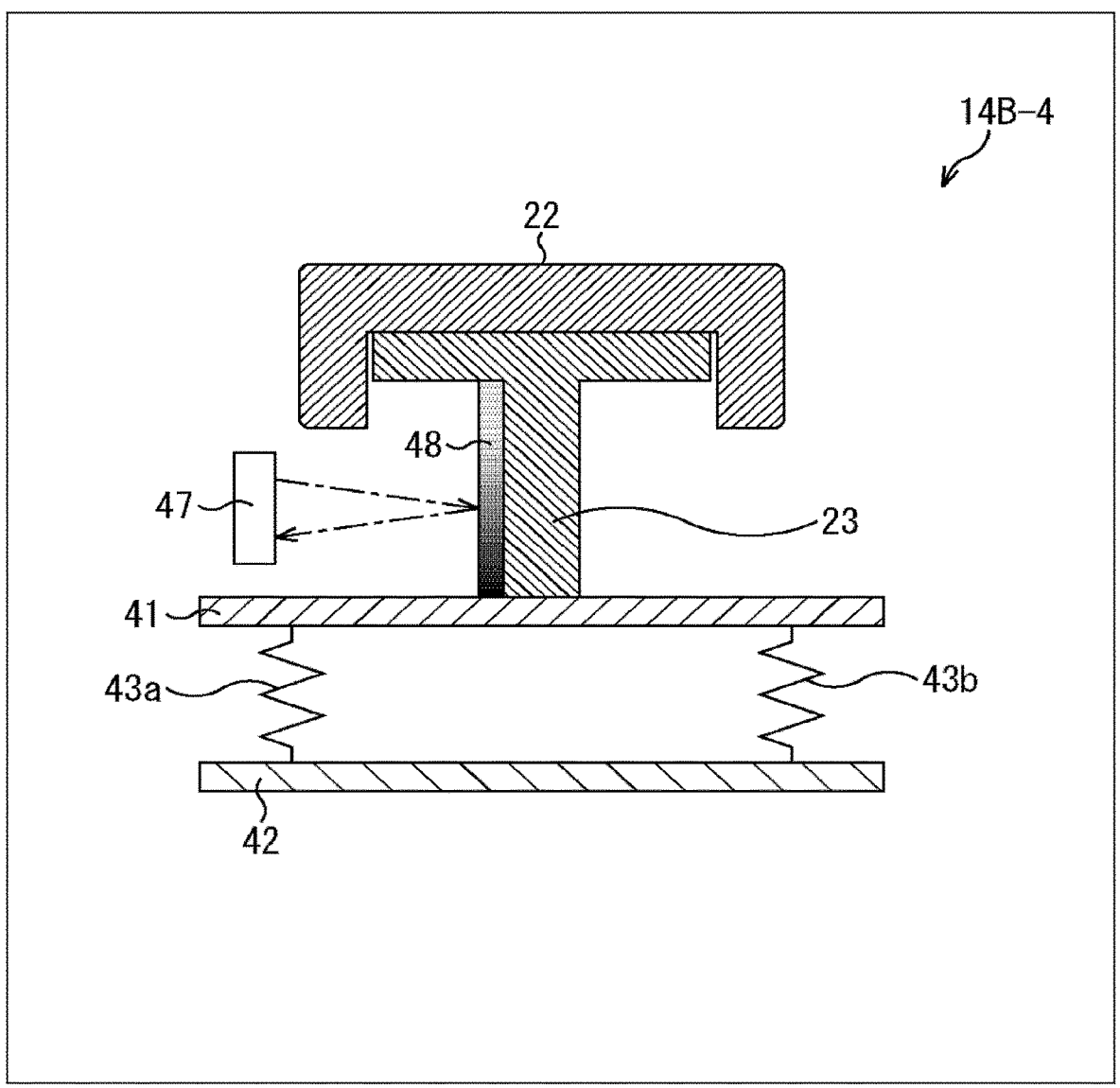
FIG. 10 is a view showing a fourth structural example for describing the stroke detection structure.

FIG. 10 shows a schematic cross-sectional view showing a fourth structural example for describing the stroke detection structure employed in the shutter operation unit 14. Note that, in a shutter operation unit 14B-4, the components same as those in the shutter operation unit 14B-1 in FIG. 7 are identified by the same reference numerals, and the detailed description thereof will be omitted.

As shown in FIG. 10, the shutter operation unit 14B-4 includes a release cover 22, a release shaft 23, a detection plate 41, a detection substrate 42, and elastic bodies 43*a* and 43*b*, and this configuration is common to the shutter operation unit 14B-1 in FIG. 7.

Then, the shutter operation unit 14B-4 is different from the shutter operation unit 14B-1 in FIG. 7 in that it is provided with a photo reflector 47 and a reflectance change sheet 48.

The photo reflector 47 is located lateral to the axis of the release shaft 23, emits light toward the reflectance change sheet 48 attached to the side surface of the release shaft 23, and detects light reflected by the reflectance change sheet 48.

The reflectance change sheet 48 is, for example, a sheet having a characteristic in which the reflectance of light changes along the stroke direction of the release shaft 23. The brightness of reflected light detected by the photo reflector 47 varies according to the stroke position of the release shaft 23.

Therefore, when the stroke position of the release shaft 23 varies in response to the release cover 22 being pushed by the user, the photo reflector 47 detects the variation in stroke position and outputs the variation as the shutter operation signal for detecting the shutter operation performed by the user.

As described above, in the shutter operation unit 14B-4, the stroke detection structure is constituted by utilizing a variation in brightness of reflected light detected by the photo reflector 46. That is, when the release cover 22 is pushed, reflected light detected by the photo reflector 47 varies, and a stroke position is detected according to the shutter operation signal corresponding to an amount of the variation.

Figure 11:
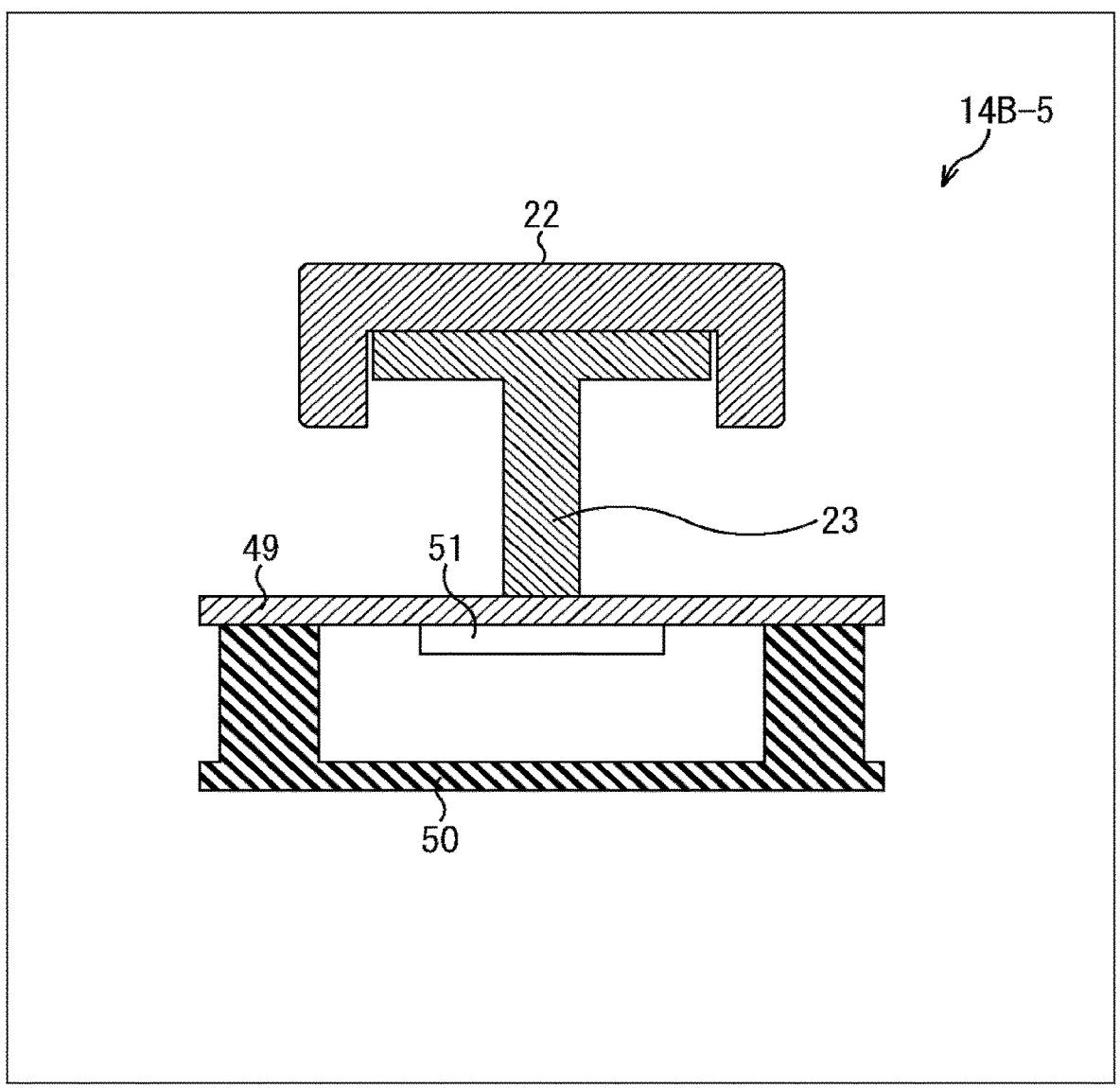
FIG. 11 is a view showing a fifth structural example for describing the stroke detection structure.

FIG. 11 shows a schematic cross-sectional view showing a fifth structural example for describing the stroke detection structure employed in the shutter operation unit 14. Note that, in a shutter operation unit 14B-5, the components same as those in the shutter operation unit 14B-1 in FIG. 7 are identified by the same reference numerals, and the detailed description thereof will be omitted.

As shown in FIG. 11, the shutter operation unit 14B-5 includes a release cover 22 and a release shaft 23, and this configuration is common to the shutter operation unit 14B-1 in FIG. 7.

Then, the shutter operation unit 14B-5 is different from the shutter operation unit 14B-1 in FIG. 7 in that it is provided with a plate-shaped elastic body 49, a frame 50, and a strain sensor 51.

The plate-shaped elastic body 49 is a plate-shaped member having elasticity, and the portion near the outer periphery is fixed by the frame 50. For example, the plate-shaped elastic body 49 is distorted so that the central portion is curved downward in response to the release cover 22 being pushed by the user.

The frame 50 is a frame-shaped member that fixes the vicinity of the outer periphery of the plate-shaped elastic body 49, and is fixed to the housing 21 (see FIG. 2) of the camera body 13 (not shown).

The strain sensor 51 is attached to the plate-shaped elastic body 49 on the side opposite to the side where the release shaft 23 contacts, and detects a strain generated in the plate-shaped elastic body 49.

Therefore, when the stroke position of the release shaft 23 varies in response to the release cover 22 being pushed by the user, the strain sensor 51 detects strain generated in the plate-shaped elastic body 49 and outputs the detected strain as the shutter operation signal for detecting the shutter operation performed by the user.

As described above, the shutter operation unit 14B-5 is configured to detect the stroke at the time of shutter operation by a variation in strain detected by the strain sensor 51. That is, the strain detected by the strain sensor 51 varies when the release cover 22 is pushed, and the stroke position is detected according to the shutter operation signal corresponding to an amount of the variation.

As described with reference to FIGS. 7 to 11, the stroke detection structure employed in the shutter operation unit 14 can detect the stroke position in a non-contact manner.

<Detailed Configuration Example of Imaging Device>

Figure 12:
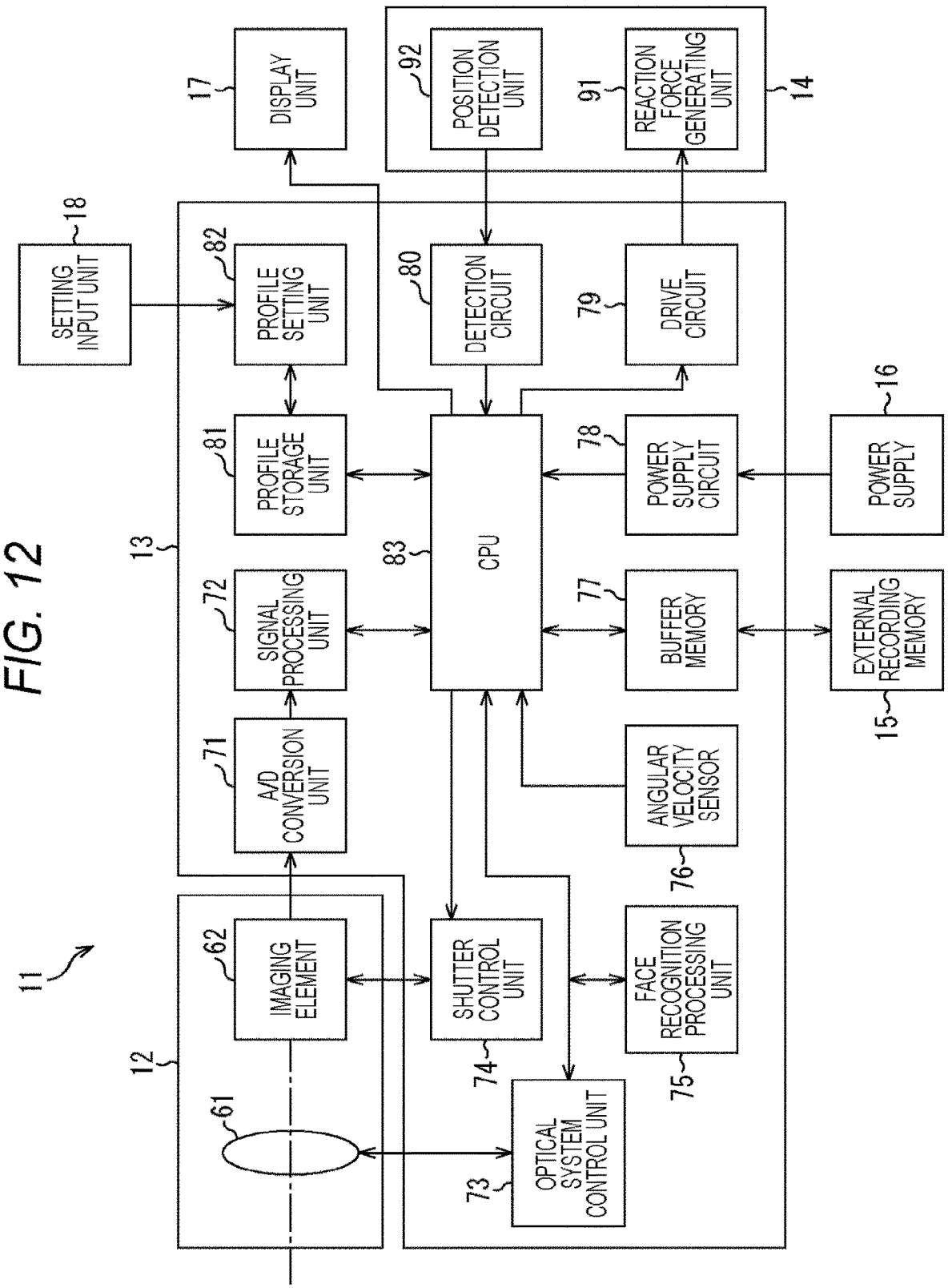
FIG. 12 is a block diagram showing a detailed configuration example of the imaging device.

FIG. 12 is a block diagram showing a detailed configuration example of the imaging device 11.

As shown in FIG. 12, the imaging unit 12 includes an optical system 61 and an imaging element 62. The camera body 13 includes an A/D conversion unit 71, a signal processing unit 72, an optical system control unit 73, a shutter control unit 74, a face recognition processing unit 75, an angular velocity sensor 76, a buffer memory 77, a power supply circuit 78, a drive circuit 79, a detection circuit 80, a profile storage unit 81, a profile setting unit 82, and a CPU 83. The shutter operation unit 14 includes a reaction force generating unit 91 and a position detection unit 92.

The optical system 61 includes, for example, a plurality of lenses, an aperture, and the like, forms an image of light from a subject on a light receiving surface of the imaging element 62, and adjusts focusing, zooming, light intensity, and the like.

The imaging element 62 is, for example, a charge coupled device (CCD) image sensor or a complementary metal oxide semiconductor (CMOS) image sensor. Then, the imaging element 62 captures an image of a subject to be formed on the light receiving surface via the optical system 61, and supplies the image in an analog signal form obtained by the image capture to the A/D conversion unit 71.

The analog-to-digital (A/D) conversion unit 71 converts the analog signal supplied from the imaging element 62 into a digital signal, and supplies an image of the digital signal to the signal processing unit 72. Note that the A/D conversion unit 71 may be integrally incorporated in the imaging element 62.

The signal processing unit 72 performs various signal processing such as noise removal and up-converting on the image supplied from the A/D conversion unit 71 under the control of the CPU 83, and supplies the image that has been subjected to the signal processing to the CPU 83. Further, the signal processing unit 72 can detect the state of autofocus and automatic exposure of the image by calculation from the result of the signal processing performed on the image, and gives state information indicating the state to the CPU 83.

The optical system control unit 73 performs optical system control for controlling focusing, light intensity, or the like by the optical system 61 in accordance with the control by the CPU 83.

The shutter control unit 74 performs shutter control for controlling the exposure timing, exposure time, or the like of the imaging element 62 in accordance with the control by the CPU 83.

The face recognition processing unit 75 performs face recognition processing for recognizing a face included in the image supplied via the CPU 83, and notifies the optical system control unit 73 of, for example, an area to be focused so that the recognized face is focused.

The angular velocity sensor 76 includes, for example, a gyro that detects angular velocities in three axial directions, and supplies orientation information indicating the orientation of the imaging device 11 to the CPU 83.

The buffer memory 77 temporarily holds the image supplied via the CPU 83, and stores the image in the external storage memory 15 according to the writing speed of the external storage memory 15. Further, the buffer memory 77 acquires remaining memory capacity information indicating a remaining capacity (remaining storage capacity) of the external storage memory 15 and supplies it to the CPU 83.

The power supply circuit 78 supplies electric power supplied from the power supply 16 to each component constituting the imaging device 11. Further, the power supply circuit 78 acquires power supply information indicating electric power stored in the power supply 16 and supplies it to the CPU 83.

The drive circuit 79 is supplied with reaction force instruction information instructing the shutter operation unit 14 to generate a reaction force from the CPU 83. Then, the drive circuit 79 supplies, for example, a current or voltage required to generate the reaction force according to the reaction force instruction information to the reaction force generating unit 91. For example, the drive circuit 79 generates a reaction force by supplying electric power to the coil 25 shown in FIG. 2, or generates a reaction force by supplying a voltage to the piezoelectric element 28 shown in FIG. 4.

The detection circuit 80 detects the stroke position during the shutter operation by the user pushing the release cover 22 from the shutter operation signal supplied from the position detection unit 92 of the shutter operation unit 14, and supplies stroke position information indicating the stroke position to CPU 83.

The profile storage unit 81 stores a profile (see FIG. 13 described later) in which setting information set by the profile setting unit 82 is registered.

The profile setting unit 82 generates a profile in which various kinds of setting information input using the setting input unit 18 is registered, and stores the profile in the profile storage unit 81.

The central processing unit (CPU) 83 can control each component constituting the camera body 13, and can control the generation of a reaction force generated in the shutter operation unit 14 according to, for example, imaging-related information. Further, for example, the CPU 83 reads the profile stored in the profile storage unit 81, and supplies reaction force instruction information to the drive circuit 79 on the basis of the stroke position information supplied from the detection circuit 80. That is, the CPU 83 controls the generation of reaction force in the shutter operation unit 14 by executing reaction force control processing described later with reference to the flowcharts of FIGS. 21 to 29.

The reaction force generating unit 91 generates a reaction force by the reaction force generating structure described above with reference to FIGS. 2 to 6. For example, the reaction force generating unit 91 generates a reaction force of a magnitude controlled according to the reaction force control processing executed in the CPU 83 by passing a current supplied from the drive circuit 79 through the coil 25 in FIG. 2.

The position detection unit 92 supplies, to the detection circuit 80, a shutter operation signal obtained in response to the shutter operation performed by the user pushing the release cover 22 due to the stroke detection structure described with reference to FIGS. 7 to 11.

The imaging device 11 is configured as described above, and can vary the reaction force generated by the shutter operation unit 14 on the basis of the imaging-related information by the reaction force control processing executed by the CPU 83. Due to such a reaction force, the imaging device 11 can give imaging operation possibility information, captured image information, imaging mode information, and the like, which will be described later, as the imaging-related information. Therefore, the user can perform better imaging without visually recognizing an icon image displayed on the display unit 17, for example.

<Example of Profile>

FIG. 13 shows various setting examples of a profile set in the imaging device 11.

For example, in the profile according to a memory condition, setting information is registered which indicates that the reaction force is increased when the remaining storage capacity of the external storage memory 15 is equal to or less than a predetermined percentage (remaining card capacity: xx %) in a state in which a second stroke position S2 is detected (so-called full-push state). Similarly, setting information is registered which indicates that the reaction force is increased when, in a state where the second stroke position S2 is detected: the number of images that can be stored in the external storage memory 15 is equal to or less than a predetermined number (maximum number of images to be captured: xx), the remaining recording time of images to be stored in the external storage memory 15 is equal to or less than a predetermined time (remaining recording time: xx hours); and the time in which the remaining images that can be stored in the external storage memory 15 can be continuously captured is equal to or less than a predetermined number of seconds (remaining time for continuous image capture: 3 seconds).

Further, in the profile according to a composition condition, setting information is registered which indicates that the reaction force is increased when a vibration equal to or higher than a level (camera shake setting level) that is set when camera shake occurs in the image captured by the imaging device 11 is detected in a state where a first stroke position S1 is detected (so-called half-push state). Similarly, setting information is registered which indicates that the reaction force is increased when, in a state where the first stroke position S1 is detected: the face position is detected to be outside a range (face detection position setting range) where the face detection by the face recognition processing unit 75 is possible; and the degree of levelness of the imaging device 11 is equal or greater than a predetermined inclination (degree of levelness: 5 degrees).

Further, in the profile according to a first mode condition, setting information is registered which indicates that the reaction force is increased when the second stroke position S2 is detected while an operating mode of the imaging element 62 is set to a moving image mode for acquiring a moving image. Further, setting information is registered which indicates that the reaction force is decreased when the first stroke position S1 is detected while the operating mode of the imaging element 62 is set to a continuous image capture mode for acquiring images by continuous image capture. Further, setting information is registered which indicates that micro vibration is generated when the second stroke position S2 is detected while the operating mode of the imaging element 62 is set to an electronic shutter mode for acquiring an image using an electronic shutter.

In addition, in the profile according to a second mode condition, in addition to the setting information according to the first mode condition, setting information is registered which indicates that, when the operating mode of the imaging device 11 is set to an erroneous operation prevention mode for preventing an erroneous operation, the reaction force is always increased at a timing at which abnormality in operation speed is detected. Further, when an abnormality in the operation speed is detected, the optical system control in response to the detection of the first stroke position S1 and the shutter control in response to the detection of the second stroke position S2 are stopped so as to inhibit capturing an image. Note that an average speed, acceleration, or the like can be used as the operation speed.

In addition, in the profile according to a first AF condition, setting information is registered which indicates that the reaction force is increased when nothing is focused while the first stroke position S1 is detected. Similarly, setting information is registered which indicates that the reaction force is increased when, in a state where the first stroke position S1 is detected: pupil detection for detecting pupil is unsuccessful; or face detection for detecting the face is unsuccessful.

In addition, in the profile according to a second AF condition, setting information is registered which indicates the magnitude of the reaction force to be generated according to a degree of focus while the first stroke position S1 is detected. Here, the degree of focus represents the degree of focus on the subject, and in a case where the subject is in sharp focus, the degree of focus is high. For example, setting information is registered which indicates that: when the degree of focus is high, the reaction force is decreased; when the degree of focus is medium (between high and low), the reaction force is set to intermediate (between strong and weak); and when the degree of focus is low, the reaction force is increased.

In addition, in the profile according to a battery condition, setting information is registered which indicates that the reaction force is increased when the number of images that can be captured by the imaging device 11 with the current remaining battery capacity is equal to or less than a predetermined number (maximum number of images to be captured: xx) while the second stroke position S2 is detected. Similarly, setting information is registered which indicates that the reaction force is increased when the recording time in which images can be recorded by the imaging device 11 with the current remaining battery capacity is equal to or less than a predetermined time (remaining recording time: xx hours) while the second stroke position S2 is detected. Further, setting information is registered which indicates that the reaction force is increased at all stroke positions when the current remaining battery capacity is equal to or less than a predetermined percentage (remaining battery capacity: 20%).

Pieces of setting information corresponding to various conditions as described above are set as profiles. However, setting information other than the conditions described above may be set as a profile. Then, the reaction force control processing according to the imaging-related information is performed by referring to these profiles. Here, the imaging-related information includes imaging operation possibility information according to the memory condition, the battery condition, etc., captured image information according to the composition condition (for example, degree of levelness, face detection, camera shake setting), the AF condition (degree of focus, focusing position), etc., imaging mode information indicating any one of various imaging modes, etc.

<Control Example of Reaction Force Control>

Control examples of reaction force control for controlling the reaction force generated in the shutter operation unit 14 will be described with reference to FIGS. 14 to 20. Note that in FIGS. 14 to 20, the horizontal axis represents stroke and the vertical axis represents reaction force. Further, the thick broken line represents the reaction force in a state where the profile condition is not satisfied, and the thin line represents the reaction force to be varied when the profile condition is satisfied.

Figure 14:
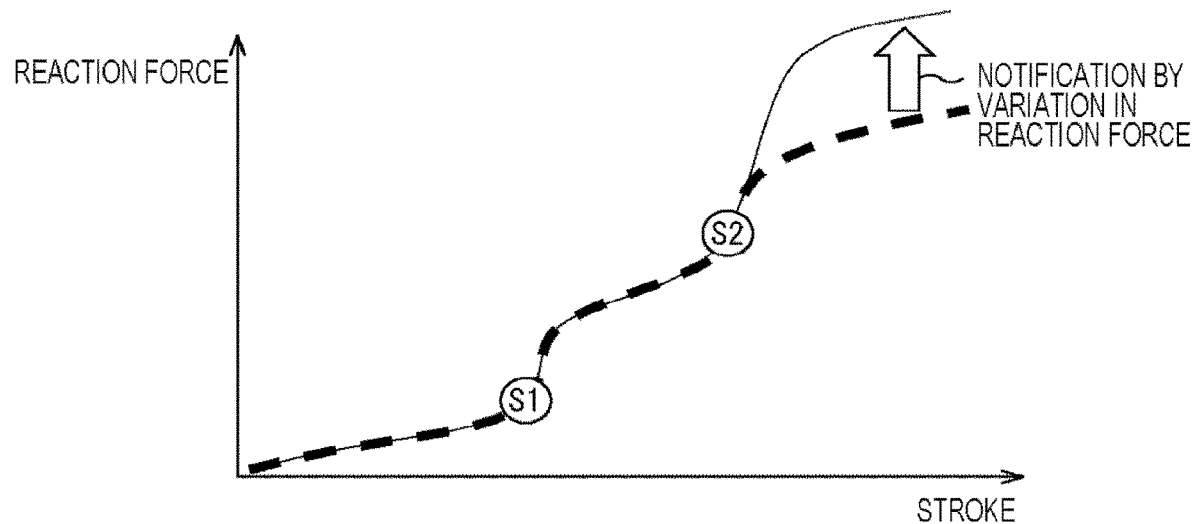
FIG. 14 is a diagram for describing a first control example of reaction force control.

FIG. 14 shows a relationship between stroke and reaction force in a first control example of reaction force generated in the shutter operation unit 14.

As shown in FIG. 14, in the first control example, when the profile condition is satisfied while the stroke position detected during the shutter operation is beyond the second stroke position S2, reaction force control for varying the reaction force so that a stronger reaction force is generated is performed.

With this control, the user can be notified that the profile condition is satisfied while the stroke position is at the second stroke position S2 and the shutter control for the imaging unit 12 is performed. For example, when the condition that the time in which the remaining images that can be stored in the external storage memory 15 can be continuously captured is equal to or less than a predetermined number of seconds according to the memory condition in the profile shown in FIG. 13 is satisfied while the user pushes the release cover 22 to the second stroke position S2 in order to perform continuous image capture, reaction force control for varying and increasing the reaction force generated in the shutter operation unit 14 is performed. Thus, the user who is performing continuous image capture can be notified that the remaining time for continuous image capture is 3 seconds or less, for example.

Figure 15:
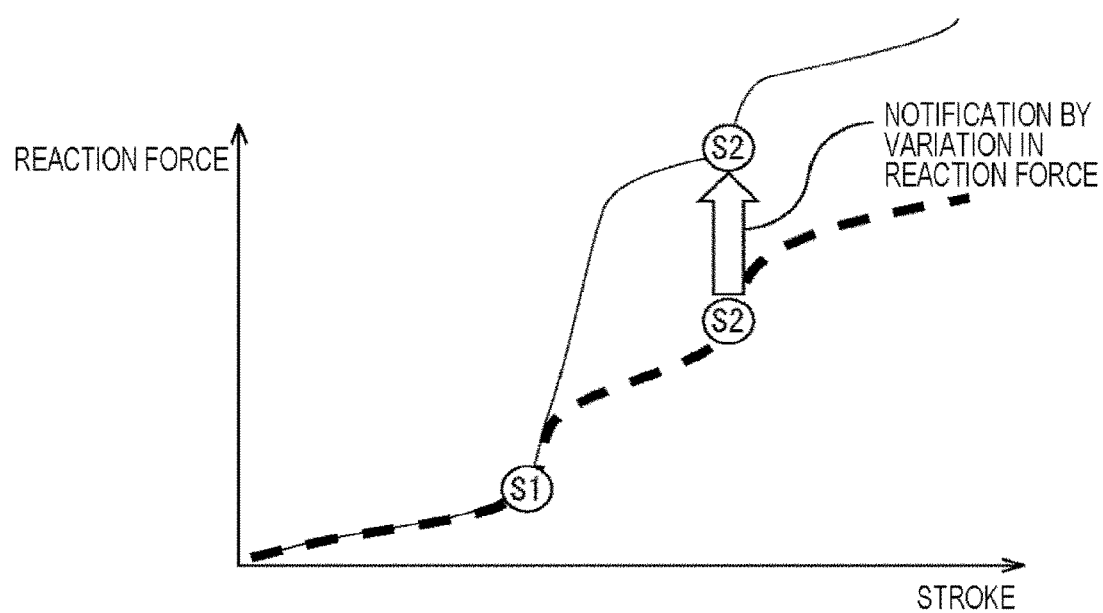
FIG. 15 is a diagram for describing a second control example of reaction force control.

FIG. 15 shows a relationship between stroke and reaction force in a second control example of reaction force generated in the shutter operation unit 14.

As shown in FIG. 15, in the second control example, when the profile condition is satisfied while the stroke position detected during the shutter operation is beyond the first stroke position S1, reaction force control for varying the reaction force so that a stronger reaction force is generated is performed.

With this control, the user can be notified that the profile condition is satisfied while the stroke position is at the first stroke position S1 and the optical system control for the imaging unit 12 is performed. For example, when the condition that the degree of levelness is 5 degrees or more according to the composition condition in the profile shown in FIG. 13 is satisfied while the user pushes the release cover 22 to the first stroke position S1 in order to bring a focus on a subject, reaction force control for varying and increasing the reaction force generated in the shutter operation unit 14 is performed. Thus, the user who is adjusting the composition by turning on an autofocus function can be notified that the degree of levelness is 5 degrees or more, for example.

Figure 16:
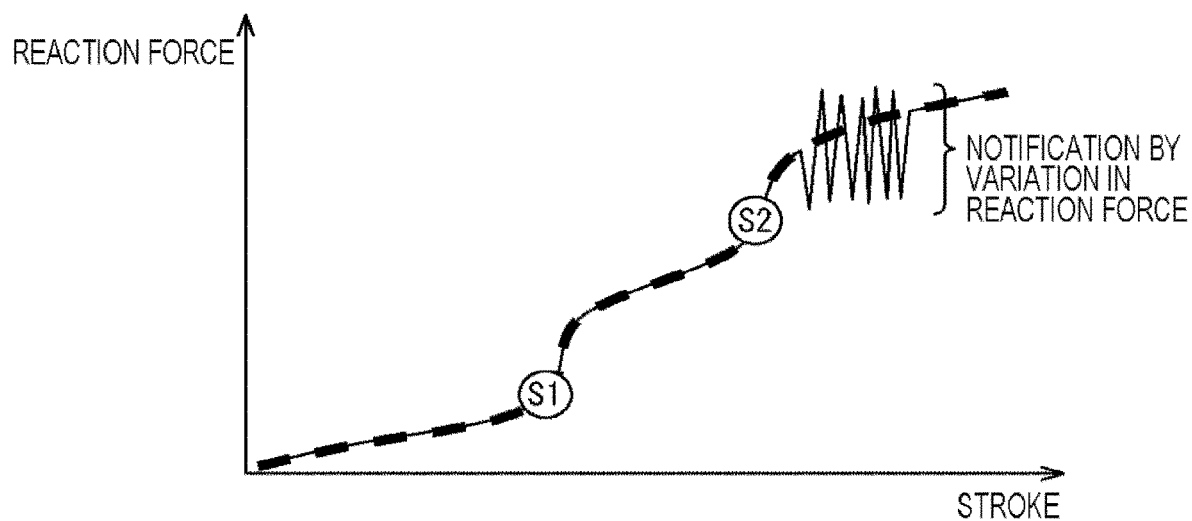
FIG. 16 is a diagram for describing a third control example of reaction force control.

FIG. 16 shows a relationship between stroke and reaction force in a third control example of reaction force generated in the shutter operation unit 14.

As shown in FIG. 16, in the third control example, when the profile condition is satisfied while the stroke position detected during the shutter operation is beyond the second stroke position S2, control for varying the reaction force so as to generate micro vibration is performed.

With this control, the user can be notified that the profile condition is satisfied while the stroke position is at the second stroke position S2 and the shutter control for the imaging unit 12 is performed. For example, when the user pushes the release cover 22 to the second stroke position S2 in order to capture an image while the operating mode of the imaging element 62 is set to the electronic shutter mode, reaction force control for converting the reaction force generated in the shutter operation unit 14 into micro vibration is performed according to the mode condition in the profile shown in FIG. 13. Thus, the user who is capturing an image can be notified that the image capture is performed in the electronic shutter mode, for example.

Figure 17:
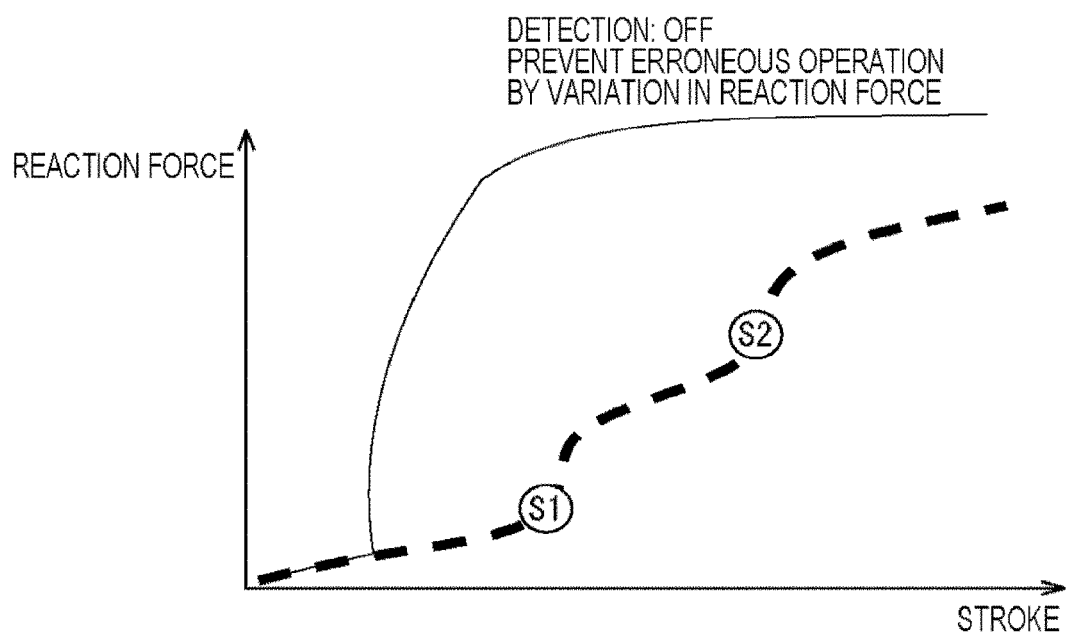
FIG. 17 is a diagram for describing a fourth control example of reaction force control.

FIG. 17 shows a relationship between stroke and reaction force in a fourth control example of reaction force generated in the shutter operation unit 14.

As shown in FIG. 17, the fourth control example indicates an example of performing reaction force control for varying the reaction force so that the strongest reaction force is generated at the timing at which the profile condition is satisfied, regardless of the stroke position detected during the shutter operation.

With this control, despite the stroke position detected during the shutter operation, the strongest reaction force can be constantly generated when the profile condition is satisfied. For example, when an object accidentally touches the release cover 22, the speed (hereinafter referred to as a release operation speed) at which the stroke position varies due to the contact is higher than the release operation speed when the user performs a shutter operation, and thus, an occurrence of abnormality can be detected. Therefore, in a case where the operating mode of the imaging device 11 is set to the erroneous operation prevention mode, the strongest reaction force is generated at the timing at which an abnormality in the release operation speed is detected. As a result, it is possible to prevent erroneous operation due to accidental contact of an object and prevent damage due to an impact at that time. At this time, the optical system control in response to the detection of the first stroke position S1 and the shutter control in response to the detection of the second stroke position S2 are stopped so as to inhibit image capture.

Figure 18:
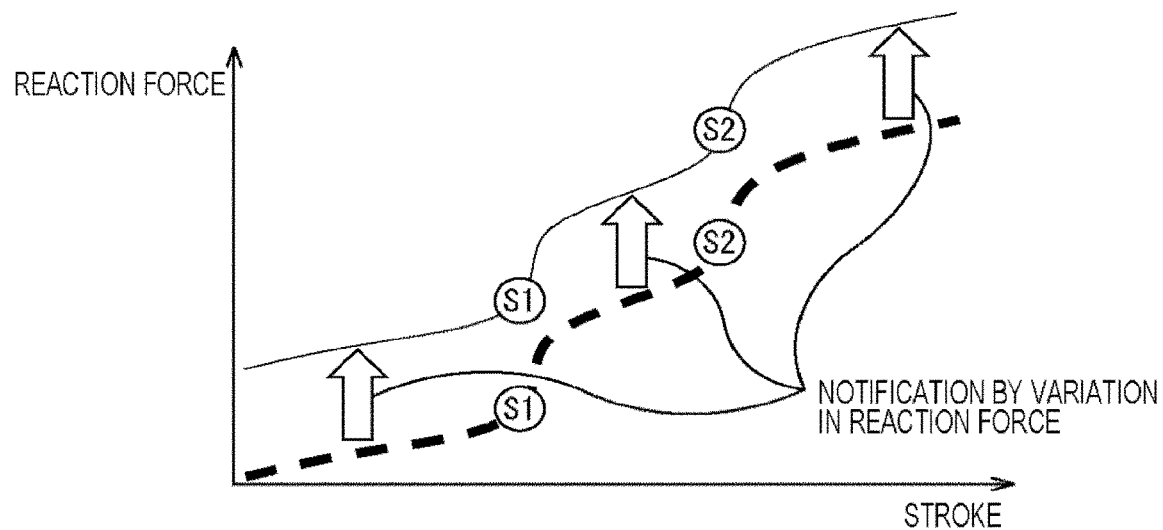
FIG. 18 is a diagram for describing a fifth control example of reaction force control.

FIG. 18 shows a relationship between stroke and reaction force in a fifth control example of reaction force generated in the shutter operation unit 14.

As shown in FIG. 18, the fifth control example indicates an example of performing reaction force control for varying the reaction force so that a stronger reaction force is constantly generated when the profile condition is satisfied, regardless of the stroke position detected during the shutter operation.

With this control, despite the stroke position detected during the shutter operation, the user can be always notified that the profile condition is satisfied. For example, reaction force control for varying the reaction force so that a stronger reaction force is generated is performed when the condition that the remaining battery capacity is 20% or less is satisfied according to the battery condition in the profile shown in FIG. 13. Thus, the user who is performing the shutter operation of pushing the release cover 22 can be always notified that the remaining battery capacity is 20% or less, for example.

Figure 19:
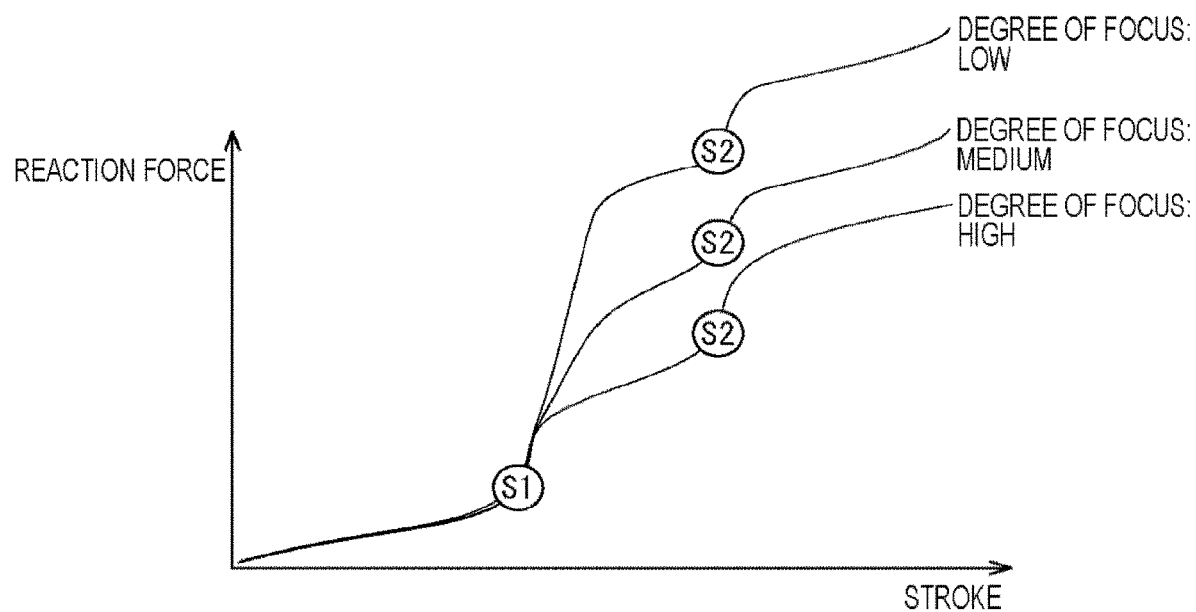
FIG. 19 is a diagram for describing a sixth control example of reaction force control.

FIG. 19 shows a relationship between stroke and reaction force in a sixth control example of reaction force generated in the shutter operation unit 14.

As shown in FIG. 19, the sixth control example indicates an example of performing reaction force control for differing the magnitude of the reaction force to be generated according to the condition in the profile at a timing at which the stroke position detected during the shutter operation is beyond the first stroke position S1.

With this control, the user can be notified which condition in the profile is satisfied when the stroke position is beyond the first stroke position S1 and the optical system control for the imaging unit 12 is started. For example, reaction force control is performed for varying the reaction force so that: when the degree of focus is high, the reaction force is decreased; when the degree of focus is medium, the reaction force is set to a medium level; and when the degree of focus is low, the reaction force is increased, according to the second AF condition in the profile shown in FIG. 13. As a result, the user turning on the autofocus function can be notified of the degree of focus that represents the degree in which the subject is focused.

Figure 20:
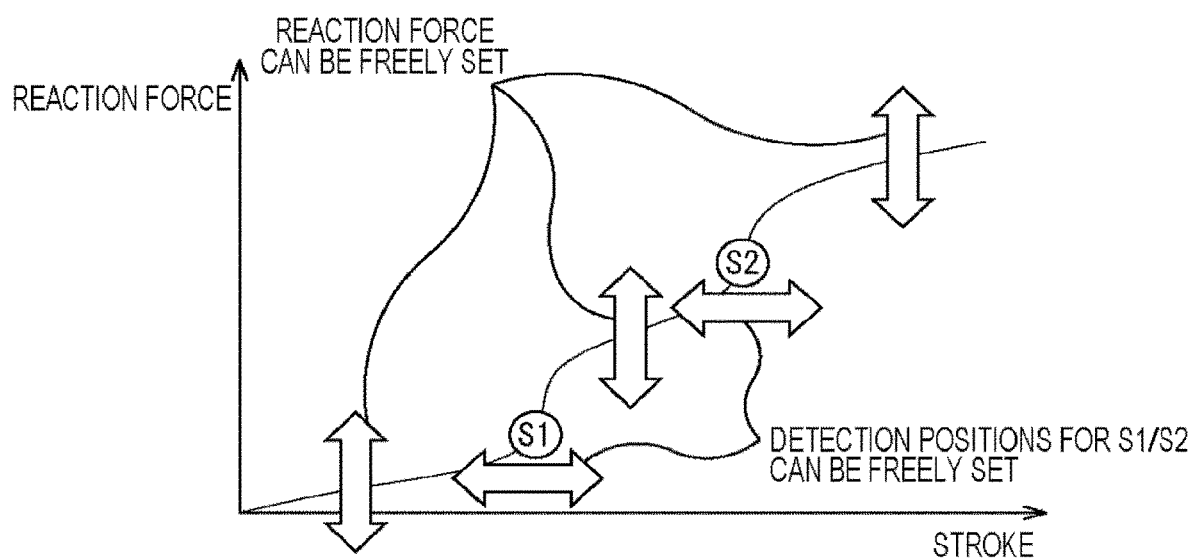
FIG. 20 is a diagram for describing a seventh control example of reaction force control.

Note that, as shown in FIG. 20, the relationship between the stroke of the reaction force generated in the shutter operation unit 14 and the reaction force can be freely set in advance to obtain a user's favorite release operation feeling. That is, the magnitude of the reaction force to be varied can be freely set, and detection positions detected as the first stroke position S1 and the second stroke position S2 can be freely set. The magnitude of the reaction force and detection positions set in this way are stored in the profile storage unit 81 as reaction force control information.

For example, in the process of starting the reaction force notification control (for example, step S12 in FIG. 21 described later), the CPU 83 can read the reaction force control information from the profile storage unit 81 and set the magnitude of the reaction force and detection position. Therefore, the CPU 83 can set the reaction force control as described with reference to FIGS. 14 to 19 so as to provide a user's favorite release operation feeling, and generate a reaction force in the shutter operation unit 14.

<Processing Example of Reaction Force Control Processing>

The reaction force control processing executed by the CPU 83 in FIG. 12 will be described with reference to FIGS. 21 to 29.

Figure 21:
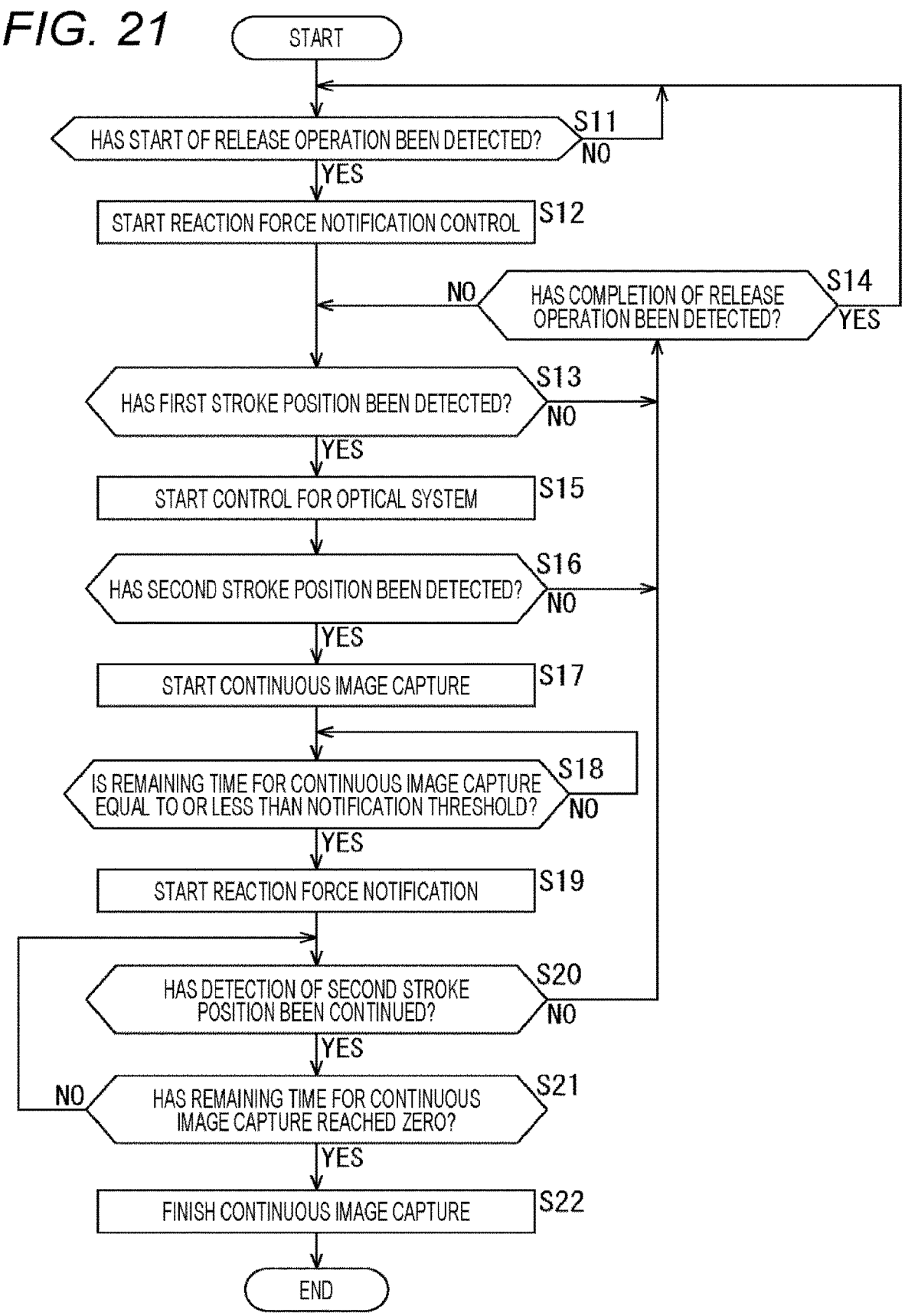
FIG. 21 is a flowchart for describing first reaction force control processing.

FIG. 21 is a flowchart for describing first reaction force control processing. In the first reaction force control processing, a profile according to the memory condition (for example, the remaining time for continuous image capture is 3 seconds or less) shown in FIG. 13 is used, and the reaction force control as described with reference to FIG. 14 is performed.

For example, the processing is started when the power of the imaging device 11 is turned on, and in step S11, the CPU 83 determines whether or not the user has started the release operation according to the stroke position information supplied from the detection circuit 80. When detecting that, due to, for example, the release cover 22 being pushed by the user, the release cover 22 has changed from the fixed position according to the stroke position indicated by the stroke position information (when detecting an operation start state), the CPU 83 determines that the user starts the release operation. Note that the operation start state indicates a state in which a pushing operation on the release cover 22 is detected while the release cover 22 is not operated, and a state up to the detection of the first stroke position S1 (half-push state).

Then, the processing waits until it is determined that the user has started the release operation, and when it is determined in step S11 that the user has started the release operation, the processing proceeds to step S12.

In step S12, the CPU 83 starts the reaction force notification control for providing a notification to the user by supplying the reaction force instruction information for giving an instruction on generation of reaction force to the drive circuit 79 on the basis of the stroke position information supplied from the detection circuit 80, the profile read from the profile storage unit 81, and the state information supplied from the signal processing unit 72, and generating the reaction force. When doing so, the CPU 83 reads the reaction force control information from the profile storage unit 81, and sets the magnitude of the reaction force to be varied and detection positions detected as the first stroke position S1 and the second stroke position S2 as described with reference to FIG. 20.

In step S13, the CPU 83 determines whether or not the first stroke position S1 (half-push state) has been detected according to the stroke position information supplied from the detection circuit 80.

When the CPU 83 determines in step S13 that the first stroke position S1 has not been detected, the processing proceeds to step S14.

In step S14, the CPU 83 determines whether or not the user has finished the release operation according to the stroke position information supplied from the detection circuit 80. For example, the CPU 83 determines that the user has finished the release operation when detecting that, because the user releases his/her finger from the release cover 22, the release cover 22 has returned to the fixed position, according to the stroke position indicated by the stroke position information.

When the CPU 83 determines in step S14 that the user has not finished the release operation, the processing returns to step S13, and the similar process is repeated thereafter. On the other hand, when the CPU 83 determines in step S14 that the user has finished the release operation, the processing returns to step S11 and waits until it is detected that the user has started the release operation.

On the other hand, when the CPU 83 determines in step S13 that the first stroke position S1 has been detected, the processing proceeds to step S15.

In step S15, the CPU 83 instructs the optical system control unit 73 to start controlling the optical system 61. Thus, the optical system control unit 73 performs optical system control for controlling focusing or light intensity by the optical system 61.

In step S16, the CPU 83 determines whether or not the second stroke position S2 (full-push state) has been detected according to the stroke position information supplied from the detection circuit 80.

When the CPU 83 determines in step S16 that the second stroke position S2 has not been detected, the processing returns to step S14, and the similar processes are repeated thereafter. On the other hand, when the CPU 83 determines in step S16 that the second stroke position S2 has been detected, the processing proceeds to step S17.

In step S17, the CPU 83 instructs the shutter control unit 74 to start continuous image capture by the imaging element 62. Thus, the shutter control unit 74 performs shutter control so that continuous image capture is carried out by the imaging element 62.

In step S18, the CPU 83 determines whether or not the remaining time for continuous image capture is equal to or less than the notification threshold (for example, 3 seconds) according to the remaining memory capacity information supplied from the buffer memory 77 and the profile read from the profile storage unit 81, and waits until the remaining time for continuous image capture becomes equal to or less than the notification threshold. Then, when the CPU 83 determines in step S18 that the remaining time for continuous image capture is equal to or less than the notification threshold, the processing proceeds to step S19.

In step S19, the CPU 83 supplies the reaction force instruction information giving an instruction on the generation of a strong reaction force to the drive circuit 79, and starts the reaction force notification by generating the reaction force in the shutter operation unit 14. As a result, the drive circuit 79 generates a current required to generate a strong reaction force and supplies it to the reaction force generating unit 91, and the reaction force generating unit 91 generates a reaction force stronger than the reaction force when the remaining time for continuous image capture is greater than the notification threshold. That is, the reaction force control for varying the reaction force so that a stronger reaction force is generated in a state where the stroke position is at or beyond the second stroke position S2 as described with reference to FIG. 14 is performed.

In step S20, the CPU 83 determines whether or not the detection of the second stroke position S2 is continued according to the stroke position information supplied from the detection circuit 80.

When the CPU 83 determines in step S20 that the detection of the second stroke position S2 is not continued, the processing returns to step S14, and the similar processes are repeated thereafter.

On the other hand, when the CPU 83 determines in step S20 that the detection of the second stroke position S2 is continued, the processing proceeds to step S21.

In step S21, the CPU 83 determines whether or not the remaining storage capacity of the external storage memory 15 is zero according to the remaining memory capacity information supplied from the buffer memory 77.

When the CPU 83 determines in step S21 that the remaining storage capacity of the external storage memory 15 is not zero, the processing returns to step S20 where the continuous image capture is continued, and the similar process is repeated thereafter.

On the other hand, when the CPU 83 determines in step S21 that the remaining storage capacity of the external storage memory 15 reaches zero, the processing proceeds to step S22.

In step S22, the CPU 83 instructs the shutter control unit 74 to end the continuous image capture by the imaging element 62. As a result, the shutter control unit 74 performs shutter control so that the continuous image capture by the imaging element 62 is finished, and then, the processing ends.

As described above, by the first reaction force control processing, the user can see that the remaining time for continuous image capture is equal or less than the notification threshold (for example, 3 seconds) by the reaction force generated in the shutter operation unit 14 without recognizing information regarding the remaining time for continuous image capture displayed on the display unit 17, for example. Note that the notification threshold of the remaining time for continuous image capture is not limited to 3 seconds, and can be set to any length of time. Further, regarding the reaction force generated in the shutter operation unit 14, the magnitude of the reaction force to be varied can also be freely set. For example, a weak reaction force may be generated.

Figure 22:
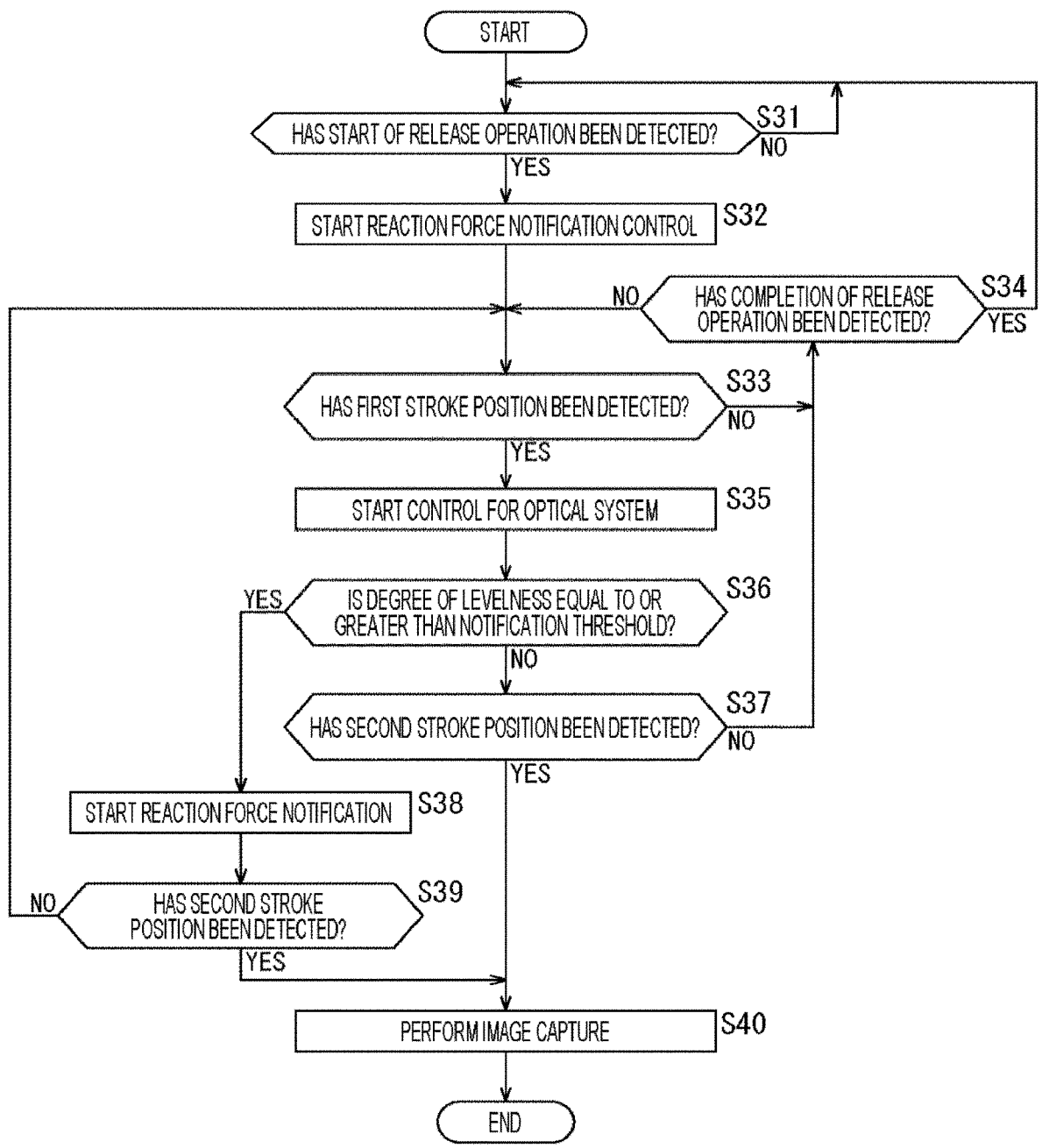
FIG. 22 is a flowchart for describing second reaction force control processing.

FIG. 22 is a flowchart for describing second reaction force control processing. In the second reaction force control processing, a profile according to the composition condition shown in FIG. 13 (for example, degree of levelness: 5 degrees or more) is used, and the reaction force control as described with reference to FIG. 15 is performed.

In steps S31 to S35, processes similar to those of steps S11 to S15 of FIG. 21 are performed. Then, in step S36, the CPU 83 determines whether or not the degree of levelness of the imaging device 11 is equal to or greater than the notification threshold (for example, degree of levelness: 5 degrees) according to the orientation information supplied from the angular velocity sensor 76.

When the CPU 83 determines in step S36 that the degree of levelness of the imaging device 11 is less than the notification threshold, the processing proceeds to step S37.

In step S37, the CPU 83 determines whether or not the second stroke position S2 has been detected according to the stroke position information supplied from the detection circuit 80. When the CPU 83 determines in step S37 that the second stroke position S2 has not been detected, the processing returns to step S34, and the similar processes are repeated thereafter.

On the other hand, when the CPU 83 determines in step S36 that the degree of levelness of the imaging device 11 is equal to or greater than the notification threshold, the processing proceeds to step S38.

In step S38, the CPU 83 supplies the reaction force instruction information giving an instruction the generation of a strong reaction force to the drive circuit 79, and starts the reaction force notification by generating the reaction force in the shutter operation unit 14. As a result, the drive circuit 79 generates a current required to generate a strong reaction force and supplies it to the reaction force generating unit 91, and the reaction force generating unit 91 generates a reaction force stronger than the reaction force when the degree of levelness of the imaging device 11 is smaller than the notification threshold. That is, the reaction force control for varying the reaction force so that a stronger reaction force is generated in a state where the stroke position is at or beyond the first stroke position S1 as described with reference to FIG. 15 is performed.

In step S39, the CPU 83 determines whether or not the second stroke position S2 has been detected according to the stroke position information supplied from the detection circuit 80. When the CPU 83 determines in step S39 that the second stroke position S2 has not been detected, the processing returns to step S33, and the similar processes are repeated thereafter.

On the other hand, when the CPU 83 determines in step S37 or S39 that the second stroke position S2 has been detected, the processing proceeds to step S40.

In step S40, the CPU 83 instructs the shutter control unit 74 to perform image capture by the imaging element 62. Thus, the shutter control unit 74 performs shutter control so that the image capture by the imaging element 62 is performed, and then, the processing ends.

As described above, by the second reaction force control processing, the user can see that the degree of levelness is equal or greater than the notification threshold (for example, degree of levelness of 5 degrees) by the reaction force generated in the shutter operation unit 14 without recognizing information regarding the degree of levelness displayed on the display unit 17, for example. Note that the notification threshold of the degree of levelness is not limited to 5 degrees, and can be set to any angle. Further, regarding the reaction force generated in the shutter operation unit 14, the magnitude of the reaction force to be varied can also be freely set. For example, a weak reaction force may be generated.

Figure 23:
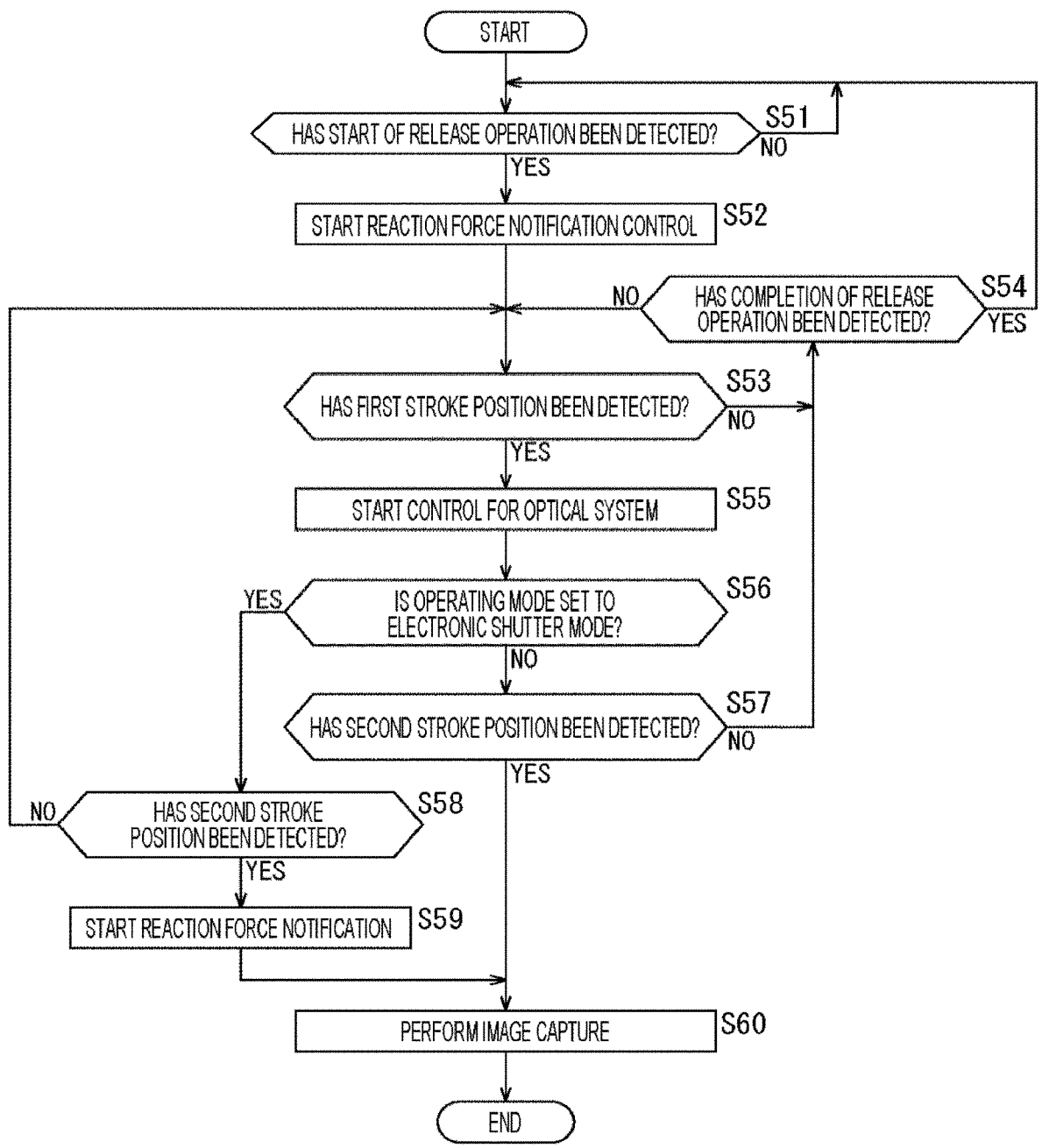
FIG. 23 is a flowchart for describing third reaction force control processing.

FIG. 23 is a flowchart for describing third reaction force control processing. In the third reaction force control processing, a profile according to the mode condition shown in FIG. 13 (for example, electronic shutter mode) is used, and the reaction force control as described with reference to FIG. 16 is performed.

In steps S51 to S55, processes similar to those of steps S11 to S15 of FIG. 21 are performed. Then, in step S56, the CPU 83 determines whether or not the operating mode of the imaging element 62 is set to the electronic shutter mode.

When the CPU 83 determines in step S56 that the operating mode of the imaging element 62 is not set to the electronic shutter mode, the processing proceeds to step S57.

In step S57, the CPU 83 determines whether or not the second stroke position S2 has been detected according to the stroke position information supplied from the detection circuit 80. When the CPU 83 determines in step S57 that the second stroke position S2 has not been detected, the processing returns to step S54, and the similar processes are repeated thereafter.

On the other hand, when the CPU 83 determines in step S56 that the operating mode of the imaging element 62 is set to the electronic shutter mode, the processing proceeds to step S58.

In step S58, the CPU 83 determines whether or not the second stroke position S2 has been detected according to the stroke position information supplied from the detection circuit 80. When the CPU 83 determines in step S58 that the second stroke position S2 has not been detected, the processing returns to step S53, and the similar processes are repeated thereafter.

On the other hand, when the CPU 83 determines in step S58 that the second stroke position S2 has been detected, the processing proceeds to step S59.

In step S59, the CPU 83 supplies the reaction force instruction information giving an instruction on the generation of micro vibration to the drive circuit 79, and starts the reaction force notification by varying the reaction force so that micro vibration is generated in the shutter operation unit 14. Thus, the drive circuit 79 generates a voltage required to generate micro vibration and supplies it to the reaction force generating unit 91, and the reaction force generating unit 91 generates micro vibration. That is, the reaction force control for varying the reaction force so that micro vibration is generated in a state where the stroke position is at or beyond the second stroke position S2 as described with reference to FIG. 16 is performed.

On the other hand, when the CPU 83 determines in step S57 that the second stroke position S2 has been detected, or after the process of step S59, the processing proceeds to step S60.

In step S60, the CPU 83 instructs the shutter control unit 74 to perform image capture by the imaging element 62. Thus, the shutter control unit 74 performs shutter control so that the image capture by the imaging element 62 is performed, and then, the processing ends.

As described above, by the third reaction force control processing, the user can see that the operating mode of the imaging element 62 is set to the electronic shutter mode by the reaction force generated in the shutter operation unit 14 without recognizing information regarding the operating mode displayed on the display unit 17, for example. Further, the strength and time of the micro vibration generated in the shutter operation unit 14 can also be freely set.

Figure 24:
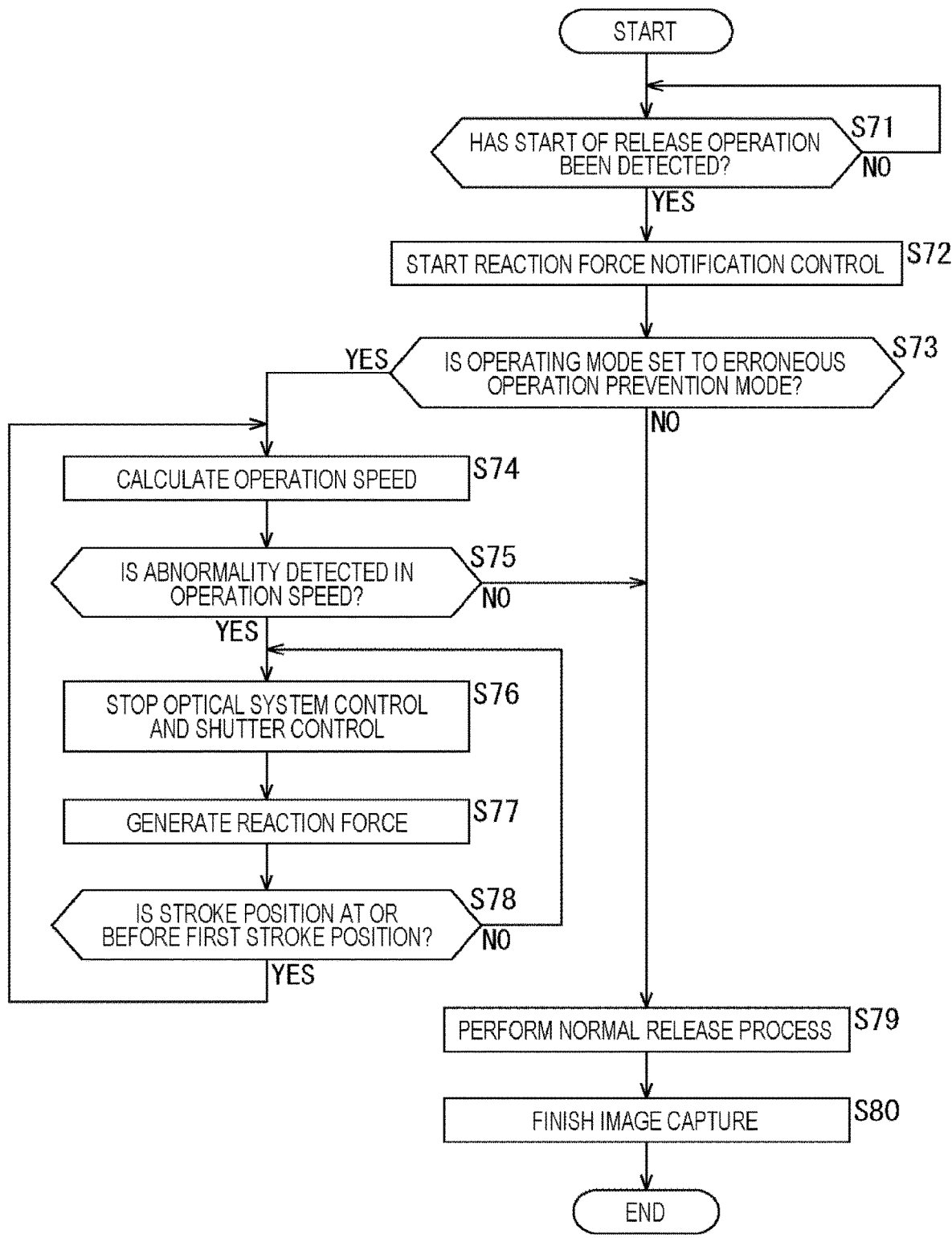
FIG. 24 is a flowchart for describing fourth reaction force control processing.

FIG. 24 is a flowchart for describing fourth reaction force control processing. In the fourth reaction force control processing, a profile according to the second mode condition shown in FIG. 13 (for example, erroneous operation prevention mode) is used, and the reaction force control as described with reference to FIG. 17 is performed.

In steps S71 and S72, processes similar to those of steps S11 and S12 of FIG. 21 are performed. Then, in step S73, the CPU 83 determines whether or not the operating mode of the imaging device 11 is set to the erroneous operation prevention mode.

When the CPU 83 determines in step S73 that the operating mode of the imaging device 11 is set to the erroneous operation prevention mode, the processing proceeds to step S74.

In step S74, the CPU 83 calculates the release operation speed from a variation in stroke position indicated by the stroke position information supplied from the detection circuit 80.

In step S75, the CPU 83 determines whether or not an abnormality has been detected in the release operation speed calculated in step S75. For example, when the release operation speed is higher than a preset abnormal speed, the CPU 83 determines that an abnormality has been detected in the release operation speed.

When the CPU 83 determines in step S75 that an abnormality has been detected in the release operation speed, the processing proceeds to step S76.

In step S76, the CPU 83 stops the optical system control and the shutter control so that, even when the first stroke position S1 or the second stroke position S2 is detected by the stroke position information supplied from the detection circuit 80, such controls are not performed.

In step S77, the CPU 83 supplies the reaction force instruction information giving an instruction on the generation of the strongest reaction force to the drive circuit 79, and generates the reaction force in the shutter operation unit 14. Thus, the drive circuit 79 generates a current required to generate the strongest reaction force and supplies it to the reaction force generating unit 91, and the reaction force generating unit 91 generates the strongest reaction force. That is, the reaction force control for varying the reaction force so that the strongest reaction force is generated at a timing at which an abnormality is detected in the release operation speed as described with reference to FIG. 17 is performed.

In step S78, the CPU 83 determines whether or not it is detected that the stroke position is at or before the first stroke position S1 according to the stroke position information supplied from the detection circuit 80.

When the CPU 83 determines in step S78 that the stroke position is not detected to be at or before the first stroke position S1, the processing returns to step S76, and the similar processes are repeated thereafter.

On the other hand, when the CPU 83 determines in step S78 that the stroke position is detected to be at or before the first stroke position S1, the processing returns to step S74, and the similar processes are repeated thereafter.

Then, when it is determined in step S73 that the operating mode of the imaging device 11 is not set to the erroneous operation prevention mode, or when it is determined in step S75 that no abnormality is detected in the release operation speed, the processing proceeds to step S79.

In step S79, the CPU 83 instructs the shutter control unit 74 to perform a normal release process.

In step S80, image capture by the imaging element 62 is performed by the optical system control executed by the optical system control unit 73 and the shutter control executed by the shutter control unit 74, and then, image capture is finished. Thereafter, the processing ends.

As described above, by the fourth reaction force control processing, the optical system control and the shutter control are stopped, and the strongest reaction force can be generated, when, for example, an erroneous operation due to an accidental contact between the release cover 22 and an object is detected. As a result, it is possible to prevent erroneous operation (image is unintentionally captured) due to accidental contact of an object and prevent damage due to an impact at that time. Further, the magnitude and time of the reaction force to be varied generated in the shutter operation unit 14 can also be freely set.

Figure 25:
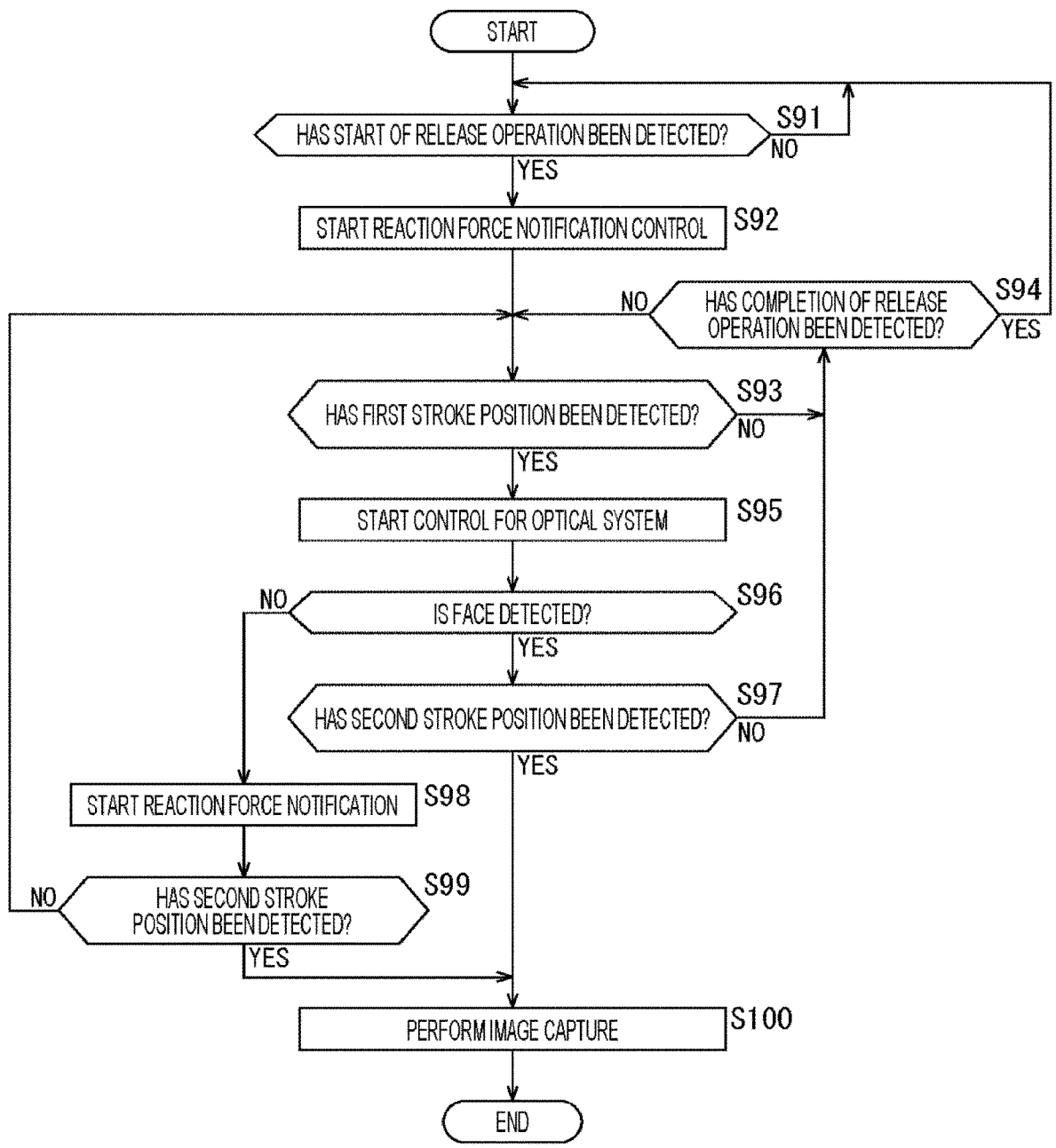
FIG. 25 is a flowchart for describing fifth reaction force control processing.

FIG. 25 is a flowchart for describing fifth reaction force control processing. In the fifth reaction force control processing, a profile according to the first AF condition shown in FIG. 13 (for example, face recognition is unsuccessful) is used, and the reaction force control as described with reference to FIG. 15 is performed.

In steps S91 to S95, processes similar to those of steps S11 to S15 of FIG. 21 are performed. Then, in step S96, the CPU 83 determines whether or not a face is detected from the image captured by the imaging element 62 according to the face recognition result of the face recognition processing performed by the face recognition processing unit 75.

When the CPU 83 determines in step S96 that the face has been detected from an image, the processing proceeds to step S97.

In step S97, the CPU 83 determines whether or not the second stroke position S2 has been detected according to the stroke position information supplied from the detection circuit 80. When the CPU 83 determines in step S97 that the second stroke position S2 has not been detected, the processing returns to step S94, and the similar processes are repeated thereafter.

On the other hand, when the CPU 83 determines in step S96 that the face has not been detected from the image, the processing proceeds to step S98.

In step S98, the CPU 83 supplies the reaction force instruction information giving an instruction on the generation of a strong reaction force to the drive circuit 79, and starts the reaction force notification by generating the reaction force in the shutter operation unit 14. As a result, the drive circuit 79 generates a current required to generate a strong reaction force and supplies it to the reaction force generating unit 91, and the reaction force generating unit 91 generates a reaction force stronger than the reaction force when the face is detected from an image. That is, the reaction force control for varying the reaction force so that a stronger reaction force is generated in a state where the stroke position is at or beyond the first stroke position S1 as described with reference to FIG. 15 is performed.

In step S99, the CPU 83 determines whether or not the second stroke position S2 has been detected according to the stroke position information supplied from the detection circuit 80. When the CPU 83 determines in step S99 that the second stroke position S2 has not been detected, the processing returns to step S93, and the similar processes are repeated thereafter.

On the other hand, when the CPU 83 determines in step S97 or S99 that the second stroke position S2 has been detected, the processing proceeds to step S100.

In step S100, the CPU 83 instructs the shutter control unit 74 to perform image capture by the imaging element 62. Thus, the shutter control unit 74 performs shutter control so that the image capture by the imaging element 62 is performed, and then, the processing ends.

As described above, by the fifth reaction force control processing, the user can see that the face is recognized by the reaction force generated in the shutter operation unit 14 without recognizing information regarding the face recognition result displayed on the display unit 17, for example. Further, regarding the reaction force generated in the shutter operation unit 14, the magnitude of the reaction force to be varied can also be freely set. For example, a weak reaction force may be generated.

Figure 26:
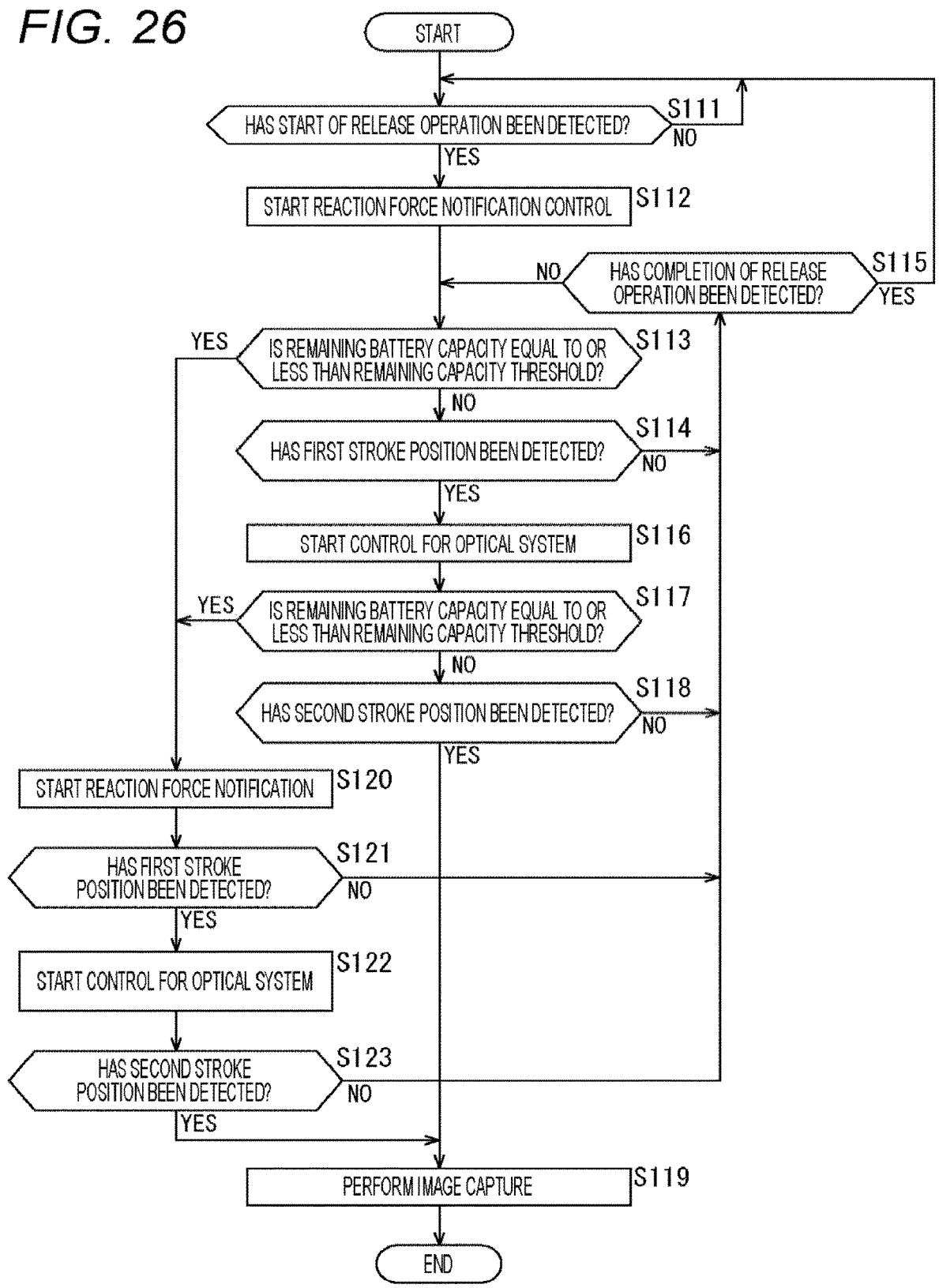
FIG. 26 is a flowchart for describing sixth reaction force control processing.

FIG. 26 is a flowchart for describing sixth reaction force control processing. In the sixth reaction force control processing, a profile according to the battery condition (for example, remaining battery capacity: 20% or less) shown in FIG. 13 is used, and the reaction force control as described with reference to FIG. 18 is performed.

In steps S111 and S112, processes similar to those of steps S11 and S12 of FIG. 21 are performed. Then, in step S113, the CPU 83 determines whether or not the current remaining battery capacity is equal to or less than a remaining capacity threshold (for example, remaining battery capacity: 20%) according to the power supply information supplied from the power supply circuit 78.

When the CPU 83 determines in step S113 that the remaining battery capacity is above the remaining capacity threshold, the processing proceeds to step S114.

In steps S114 to S116, processes similar to those of steps S13 to S15 of FIG. 21 are performed. Then, in step S117, the CPU 83 determines whether or not the current remaining battery capacity is equal to or less than the remaining capacity threshold (for example, remaining battery capacity: 20%).

When the CPU 83 determines in step S117 that the remaining battery capacity is above the remaining capacity threshold, the processing proceeds to step S118.

In step S118, the CPU 83 determines whether or not the second stroke position S2 has been detected according to the stroke position information supplied from the detection circuit 80.

When the CPU 83 determines in step S118 that the second stroke position S2 has not been detected, the processing returns to step S115, and the similar processes are repeated thereafter.

On the other hand, when the CPU 83 determines in step S113 or S117 that the current remaining battery capacity is equal to or less than the remaining capacity threshold, the processing proceeds to step S120.

In step S120, the CPU 83 supplies the reaction force instruction information giving an instruction on the generation of a strong reaction force to the drive circuit 79, and starts the reaction force notification by generating the reaction force in the shutter operation unit 14. As a result, the drive circuit 79 generates a current required to generate a strong reaction force and supplies it to the reaction force generating unit 91, and the reaction force generating unit 91 generates a reaction force stronger than the reaction force when the remaining battery capacity is greater than the remaining capacity threshold. That is, the reaction force control for varying the reaction force so that a stronger reaction force is constantly generated regardless of the stroke position detected during the shutter operation as described with reference to FIG. 18 is performed.

In step S121, the CPU 83 determines whether or not the first stroke position S1 has been detected according to the stroke position information supplied from the detection circuit 80.

When the CPU 83 determines in step S121 that the first stroke position S1 has not been detected, the processing returns to step S115, and the similar processes are repeated thereafter.

On the other hand, when the CPU 83 determines in step S121 that the first stroke position S1 has been detected, the processing proceeds to step S122.

In step S122, the CPU 83 instructs the optical system control unit 73 to start controlling the optical system 61. Thus, the optical system control unit 73 performs optical system control for controlling focusing or light intensity by the optical system 61.

In step S123, the CPU 83 determines whether or not the second stroke position S2 has been detected according to the stroke position information supplied from the detection circuit 80.

When the CPU 83 determines in step S123 that the second stroke position S2 has not been detected, the processing returns to step S115, and the similar processes are repeated thereafter.

Then, when the CPU 83 determines in step S118 or S123 that the second stroke position S2 has been detected, the processing proceeds to step S119.

In step S119, the CPU 83 instructs the shutter control unit 74 to perform image capture by the imaging element 62. Thus, the shutter control unit 74 performs shutter control so that the image capture by the imaging element 62 is performed, and then, the processing ends.

As described above, by the sixth reaction force control processing, the user can recognize the remaining battery capacity by the reaction force generated in the shutter operation unit 14 without recognizing information regarding the remaining battery capacity displayed on the display unit 17, for example. Further, regarding the reaction force generated in the shutter operation unit 14, the magnitude of the reaction force to be varied can also be freely set. For example, a weak reaction force may be generated.

Figure 27:
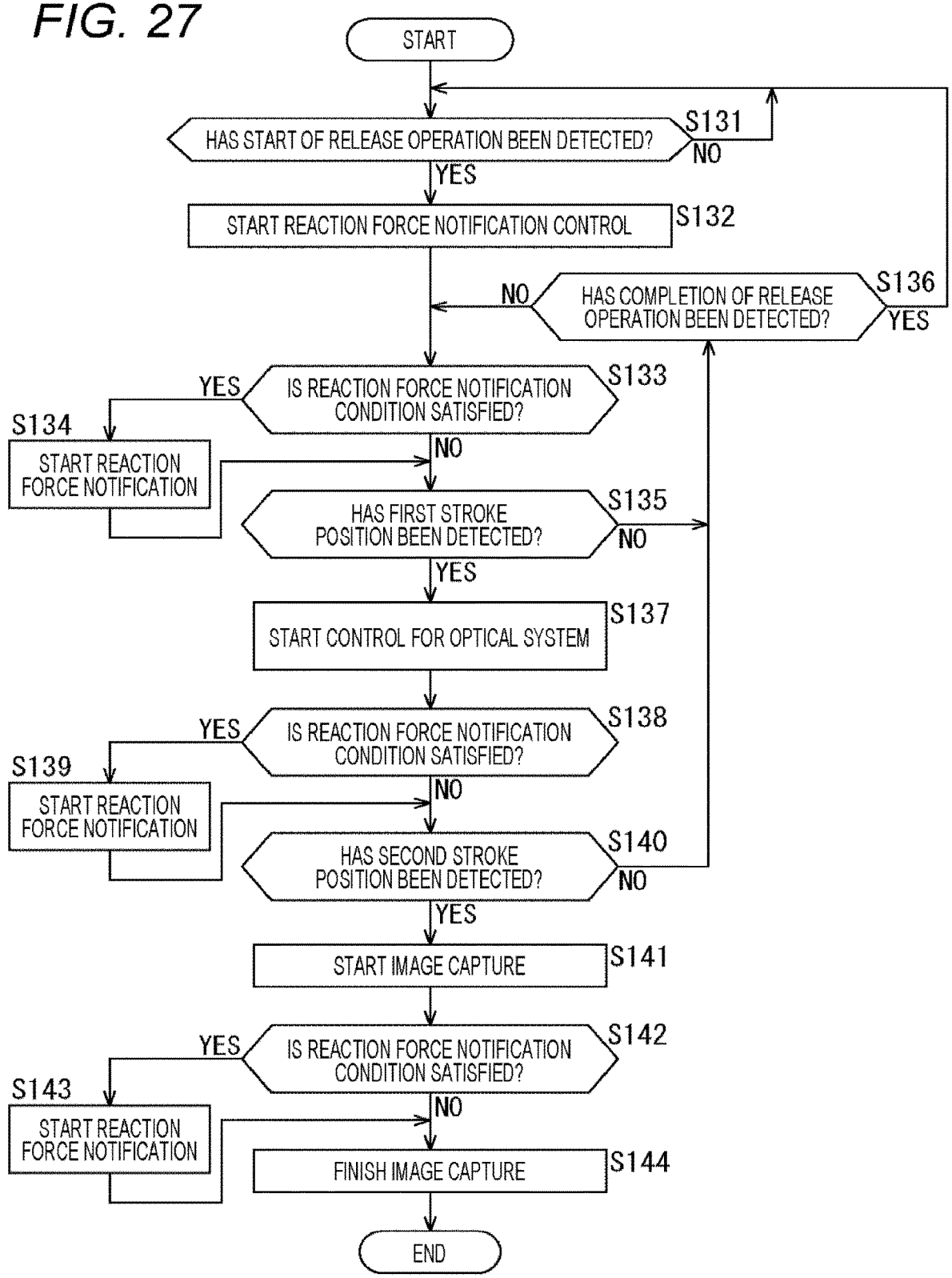
FIG. 27 is a flowchart for describing seventh reaction force control processing.

FIG. 27 is a flowchart for describing seventh reaction force control processing. In the seventh reaction force control processing, a profile according to various conditions (hereinafter referred to as reaction force notification condition) shown in FIG. 13 is used, and simpler reaction force control is performed.

In steps S131 and S132, processes similar to those of steps S11 and S12 of FIG. 21 are performed. Then, in step S133, the CPU 83 determines whether or not the reaction force notification condition that can be determined before the optical system control and the shutter control are performed among all the reaction force notification conditions is satisfied.

When the CPU 83 determines in step S133 that the reaction force notification condition is satisfied, the processing proceeds to step S134 and starts reaction force notification corresponding to the reaction force notification condition. For example, when the reaction force notification condition that the current remaining battery capacity is less than or equal to the remaining capacity threshold (for example, the remaining battery capacity: 20%) is satisfied, the reaction force control for varying the reaction force so that a stronger reaction force is constantly generated is performed.

On the other hand, when the CPU 83 determines in step S133 that the reaction force notification condition has not been satisfied or after the process of step S134, the processing proceeds to step S135.

In steps S135 to S137, processes similar to those of steps S13 to S15 of FIG. 21 are performed. Then, in step S138, the CPU 83 determines whether or not the reaction force notification condition that can be determined before the shutter control is performed among all the reaction force notification conditions is satisfied.

When the CPU 83 determines in step S138 that the reaction force notification condition is satisfied, the processing proceeds to step S139 and starts reaction force notification corresponding to the reaction force notification condition. For example, when the reaction force notification condition that the degree of levelness of the imaging device 11 is equal to or greater than the notification threshold (for example, degree of levelness: 5 degrees), the reaction force control for varying the reaction force so that a stronger reaction force is generated while the stroke position is at or beyond the first stroke position S1 is performed.

On the other hand, when the CPU 83 determines in step S138 that the reaction force notification condition has not been satisfied or after the process of step S139, the processing proceeds to step S140.

In step S140, the CPU 83 determines whether or not the second stroke position S2 has been detected according to the stroke position information supplied from the detection circuit 80. When the CPU 83 determines in step S140 that the second stroke position S2 has not been detected, the processing returns to step S136, and the similar processes are repeated thereafter.

On the other hand, when the CPU 83 determines in step S140 that the second stroke position S2 has been detected, the processing proceeds to step S141.

In step S141, the CPU 83 instructs the shutter control unit 74 to start image capture by the imaging element 62. Thus, the shutter control unit 74 performs shutter control so that image capture is started by the imaging element 62.

In step S142, the CPU 83 determines whether or not the reaction force notification condition that can be determined while the shutter control is performed among all the reaction force notification conditions is satisfied.

When the CPU 83 determines in step S142 that the reaction force notification condition is satisfied, the processing proceeds to step S143 and starts reaction force notification corresponding to the reaction force notification condition. For example, when the reaction force notification condition that the operating mode of the imaging element 62 is set to the electronic shutter mode, the reaction force control for varying the reaction force so that micro vibration is generated while the stroke position is at or beyond the second stroke position S2 is performed.

On the other hand, when the CPU 83 determines in step S142 that the reaction force notification condition has not been satisfied or after the process of step S143, the processing proceeds to step S144.

In step S144, the shutter control unit 74 performs shutter control so that the image capture by the imaging element 62 started in step S141 is finished, and then, the processing ends.

As described above, by the seventh reaction force control processing, it is possible to notify the user of a plurality of reaction force notification conditions by a reaction force generated in the shutter operation unit 14. Further, regarding the reaction force generated in the shutter operation unit 14, the magnitude of the reaction force to be varied can also be freely set. For example, a weak reaction force may be generated.

Figure 28:
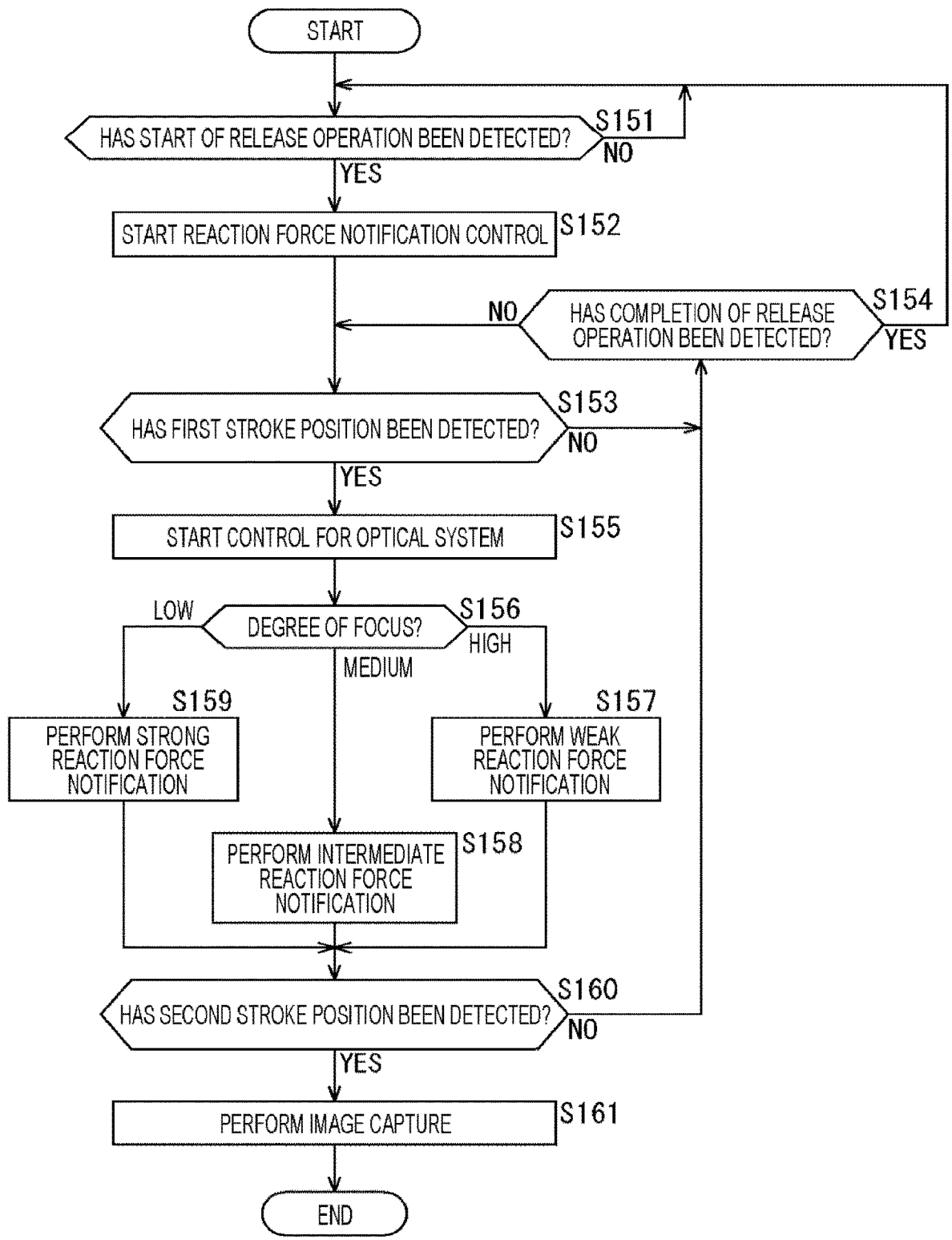
FIG. 28 is a flowchart for describing eighth reaction force control processing.

FIG. 28 is a flowchart for describing eighth reaction force control processing. In the eighth reaction force control processing, a profile according to the second AF condition shown in FIG. 13 is used, and the reaction force control as described with reference to FIG. 19 is performed.

In steps S151 to S155, processes similar to those of steps S11 to S15 of FIG. 21 are performed. Then, in step S156, the CPU 83 determines the degree of focus (high, medium, or low) on the subject included in the image according to the state information supplied from the signal processing unit 72.

When the CPU 83 determines in step S156 that the degree of focus is high, the processing proceeds to step S157. In step S157, the CPU 83 supplies the reaction force instruction information giving an instruction on the generation of a weak reaction force to the drive circuit 79, and starts the reaction force notification by generating the weak reaction force in the shutter operation unit 14. As a result, the drive circuit 79 generates a current required to generate a weak reaction force and supplies it to the reaction force generating unit 91, and the reaction force generating unit 91 generates a reaction force weaker than the reaction force when the degree of focus is not high (medium level or below). That is, the reaction force control for varying the reaction force so that a weak reaction force is generated in a state where the stroke position is at or beyond the first stroke position S1 as described with reference to FIG. 19 is performed.

When the CPU 83 determines in step S156 that the degree of focus is medium, the processing proceeds to step S158. In step S158, the CPU 83 supplies the reaction force instruction information giving an instruction on the generation of an intermediate reaction force to the drive circuit 79, and starts the reaction force notification by generating the intermediate reaction force in the shutter operation unit 14. As a result, the drive circuit 79 generates a current required to generate an intermediate reaction force and supplies it to the reaction force generating unit 91, and the reaction force generating unit 91 generates a reaction force which is intermediate with respect to the reaction force when the degree of focus is not at a medium level (lower than the high level and higher than the low level). That is, the reaction force control for varying the reaction force so that an intermediate reaction force is generated in a state where the stroke position is at or beyond the first stroke position S1 as described with reference to FIG. 19 is performed.

When the CPU 83 determines in step S156 that the degree of focus is low, the processing proceeds to step S159. In step S159, the CPU 83 supplies the reaction force instruction information giving an instruction on the generation of a strong reaction force to the drive circuit 79, and starts the reaction force notification by generating the strong reaction force in the shutter operation unit 14. As a result, the drive circuit 79 generates a current required to generate a strong reaction force and supplies it to the reaction force generating unit 91, and the reaction force generating unit 91 generates a reaction force stronger than the reaction force when the degree of focus is not at a low level (higher than the medium level). That is, the reaction force control for varying the reaction force so that a strong reaction force is generated in a state where the stroke position is at or beyond the first stroke position S1 as described with reference to FIG. 19 is performed.

After the processes of steps S157 to S159, the processing proceeds to step S160 where the CPU 83 determines whether or not the second stroke position S2 has been detected according to the stroke position information supplied from the detection circuit 80. When the CPU 83 determines in step S160 that the second stroke position S2 has not been detected, the processing returns to step S154, and the similar processes are repeated thereafter.

On the other hand, when the CPU 83 determines in step S160 that the second stroke position S2 has been detected, the processing proceeds to step S161.

In step S161, the CPU 83 instructs the shutter control unit 74 to perform image capture by the imaging element 62. Thus, the shutter control unit 74 performs shutter control so that the image capture by the imaging element 62 is performed, and then, the processing ends.

As described above, by the eighth reaction force control processing, the user can recognize the degree of focus (high, medium, low) by the reaction force generated in the shutter operation unit 14 without recognizing information regarding the degree of focus displayed on the display unit 17, for example. Further, the magnitude of the reaction force to be varied generated in the shutter operation unit 14 can also be freely set.

Figure 29:
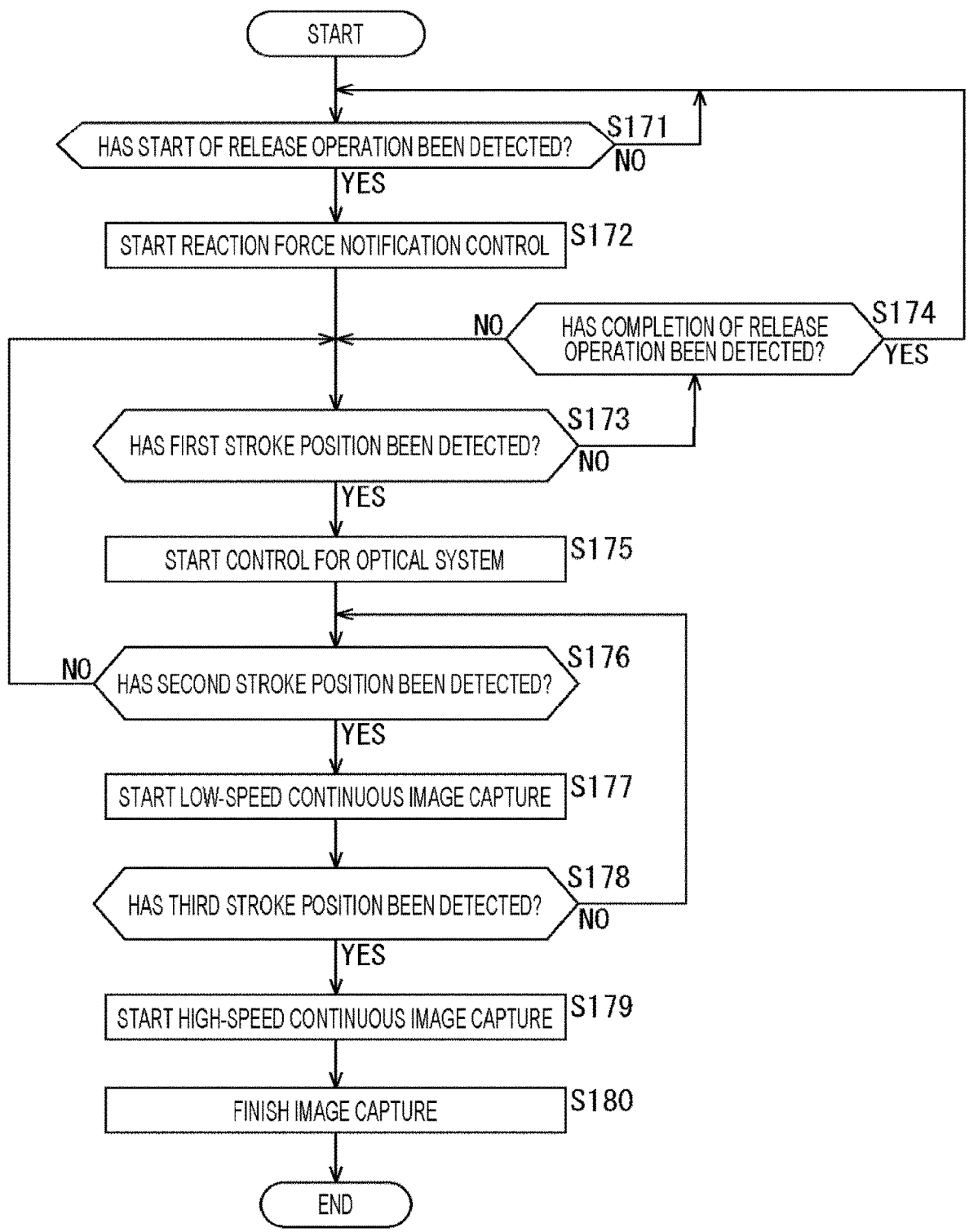
FIG. 29 is a flowchart for describing ninth reaction force control processing.

FIG. 29 is a flowchart for describing ninth reaction force control processing. Here, as described with reference to FIG. 20, the detection position set as the stroke position can be freely set, and further, the number of detection positions (states regarding the imaging operation such as half-push, full-push, or continuous image capture) can also be freely set, for example, in the reaction force control information. In the ninth reaction force control processing, three detection positions are set, and reaction force control using a first stroke position S1, a second stroke position S2, and a third stroke position S3 is performed. Note that the third stroke position S3 is set to a detection position deeper than the second stroke position S2 (due to the shutter operation for pushing the release cover 22 deeper). In addition, the magnitude of reaction force is set such that the reaction force at the first stroke position S1 is smaller than the reaction force at the second stroke position S2, and the reaction force at the second stroke position S2 is smaller than the reaction force at the third stroke position S3.

In steps S171 to S175, processes similar to those of steps S11 to S15 of FIG. 21 are performed. Then, in step S176, the CPU 83 determines whether or not the second stroke position S2 has been detected according to the stroke position information supplied from the detection circuit 80.

When the CPU 83 determines in step S176 that the second stroke position S2 has not been detected, the processing returns to step S173, and the similar processes are repeated thereafter. On the other hand, when the CPU 83 determines in step S176 that the second stroke position S2 has been detected, the processing proceeds to step S177.

In step S177, the CPU 83 instructs the shutter control unit 74 to start low-speed continuous image capture by the imaging element 62. Thus, the shutter control unit 74 performs shutter control so that low-speed continuous image capture is carried out by the imaging element 62.

In step S178, the CPU 83 determines whether or not the third stroke position S3 has been detected according to the stroke position information supplied from the detection circuit 80.

When the CPU 83 determines in step S178 that the third stroke position S3 has not been detected, the processing returns to step S176, and the similar processes are repeated thereafter. On the other hand, when the CPU 83 determines in step S178 that the third stroke position S3 has been detected, the processing proceeds to step S179.

In step S179, the CPU 83 instructs the shutter control unit 74 to start high-speed continuous image capture by the imaging element 62. Thus, the shutter control unit 74 performs shutter control so that high-speed continuous image capture is carried out by the imaging element 62.

After the continuous image capture by the imaging element 62 is finished in step S180, the processing ends.

As described above, by the ninth reaction force control processing, the user can change the continuous image capture speed to a high speed or low speed and carry out image capture only by adjusting the stroke of pushing the release cover 22 while concentrating on image capture. Note that the detection positions set as the first stroke position S1, the second stroke position S2, and the third stroke position S3 can be freely set.

Note that, although the function of changing the continuous image capture speed by detecting the stroke position is turned on in the ninth reaction force control processing, it is not limited thereto, and any function can be turned on by detecting the stroke position. Further, the reaction force controls mentioned above can be applied in combination for the reaction force generated at each of the first stroke position S1, the second stroke position S2, and the third stroke position S3.

With the reaction force control processing as described with reference to FIGS. 21 to 29, the imaging device 11 can allow the user to recognize various kinds of conditions indicated in the profile shown in FIG. 13 without displaying information in the display unit 17. Thus, the visibility of an image on the display unit 17 can be improved, and the user can satisfactorily check the composition of the image displayed on the display unit 17.

Further, in the imaging device 11, the user can freely set the type of notification condition, the notification method, and the like, and the user can recognize those conditions while concentrating on image capture. Further, the imaging device 11 can set and give various conditions such as conditions other than those indicated in the profile shown in FIG. 13.

Further, since the imaging device 11 gives a notification by increasing the reaction force, the imaging device 11 can notify a user of a condition according to the profile by avoiding an occurrence of erroneous operation or camera shake, as compared to the stimulus notification as disclosed in Patent Document 1 described above, for example.

In addition, in the imaging device 11, the user can freely set the magnitude of the reaction force to be generated in the shutter operation unit 14, the stroke position where the reaction force is generated, and the like so as to obtain a user's favorite release operation feeling. Further, it is possible to improve durability of the imaging device 11 by detecting the stroke position in a non-contact manner.

<Configuration Example of Computer>

Next, the series of processes (control method) described above can be performed by hardware or software. In a case where the series of processes is performed by software, a program constituting the software is installed on a general-purpose computer or the like.

Figure 30:
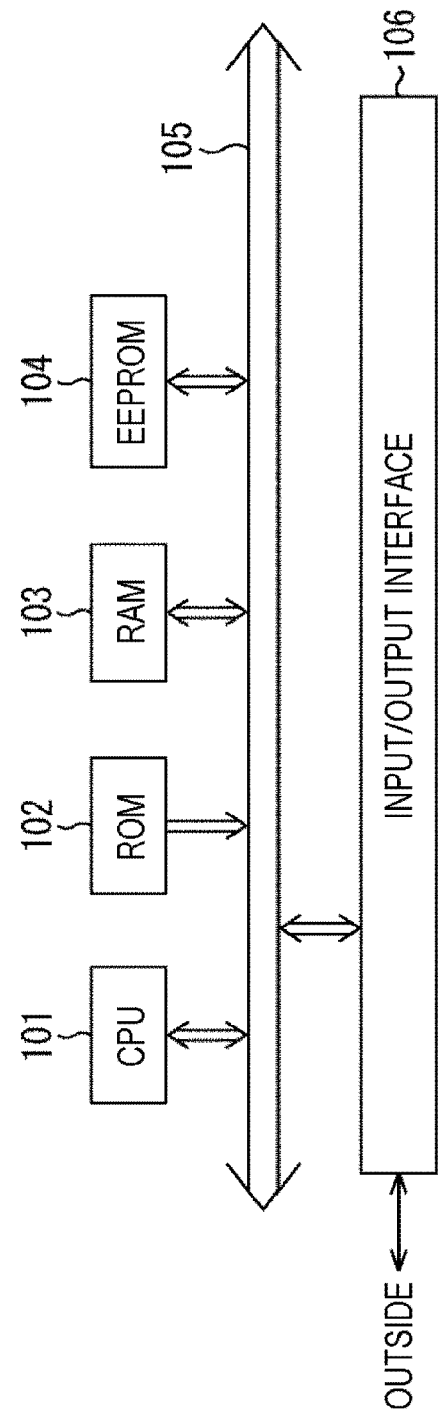
FIG. 30 is a block diagram showing a configuration example of a computer to which the present technology is applied according to an embodiment.

FIG. 30 is a block diagram showing a configuration example of a computer on which a program for executing the series of processes described above is installed according to an embodiment.

In the computer, a central processing unit (CPU) 101, a read only memory (ROM) 102, a random access memory (RAM) 103, and an electronically erasable and programmable read only memory (EEPROM) 104 are connected to each other by a bus 105. An input/output interface 106 is further connected to the bus 105, and the input/output interface 106 is connected to the outside.

In the computer configured as described above, the CPU 101 loads the program stored in, for example, the ROM 102 and the EEPROM 104 into the RAM 103 via the bus 105, and executes the program, whereby the series of processes described above is performed. In addition, the program executed by the computer (CPU 101) can be written in advance in the ROM 102, or can be installed or updated in the EEPROM 104 from the outside via the input/output interface 106.

Here, in the present specification, it is not necessary that the processes performed by the computer according to the program are executed on a time-series basis in the order described as flowchart. That is, the processes performed by the computer according to the program also include processes executed in parallel or individually (for example, parallel processing or processing by an object).

Further, the program may be processed by a single computer (processor) or may be distributed to and executed by a plurality of computers. In addition, the program may be executed by being transferred to a distant computer.

Further, in the present specification, a "system" means a set of a plurality of components (devices, modules (parts), etc.), and all constituent elements need not be necessarily in the same housing. Therefore, a plurality of devices housed in separate housings and connected via a network, and a single device in which a plurality of modules are housed in one housing are regarded as a system. Specifically, the present disclosure may employ a structure in which the shutter operation unit 14 is an independent device from the imaging device 11 including the drive circuit 79, a part of the CPU 83, and the like, and the shutter operation unit 14 and the imaging device 11 may be connected via a network.

Further, a configuration described as a single device (or a processing unit) may be divided and configured as a plurality of devices (or processing units), for example. On the contrary, configurations described as a plurality of devices (or processing units) in the above example may be configured as a single device (or processing unit). Further, a configuration not described above may be added to a configuration of each device (or each processing unit). Further, as long as a configuration or an operation of the entire system is substantially the same, a part of a configuration of a certain device (or processing unit) may be included in a configuration of another device (or another processing unit).

Further, the present technology can employ, for example, a configuration of cloud computing in which one function is shared by a plurality of apparatuses via a network and processed in cooperation with each other.

Further, for example, the program described above may be executed in any device. In that case, it is only required that the device have necessary functions (functional blocks, etc.) so that necessary information can be obtained.

Further, for example, steps described in the above-described flowcharts may be executed by a single device or shared and executed by a plurality of devices. Further, in a case where multiple processes are included in one step, the multiple processes included in the one step may be executed by a single device or may be shared and executed by a plurality of devices. In other words, multiple processes included in one step can be executed as processes of a plurality of steps. On the contrary, the processes described as a plurality of steps can be executed as one step.

Note that, in the program executed by the computer, processes of steps describing the program may be executed on a time-series basis in the order described in this specification or may be executed in parallel or individually at necessary timings such as when the processes are called. In other words, as long as there is no inconsistency, processes of steps may be executed in an order different from the abovementioned order. Further, processes of steps describing the program may be executed in parallel with a process of another program or may be executed in combination with a process of another program.

It should be noted that a plurality of the present technologies described in the present specification can be independently implemented as long as there is no inconsistency. It is obvious that any plurality of the present technologies can be used in combination. For example, some or all of the present technologies described in any of the embodiments may be combined with some or all of the present technologies described in other embodiments. In addition, some or all of any of the present technologies may be implemented in combination with other technologies not described above.

<Example of Combination of Configurations>

It is to be noted that the present technology may also have the following configurations.

(1)

An imaging device including:

an operation unit;

a reaction force generating unit that generates a reaction force with respect to an operation direction of the operation unit; and a control unit that sets the reaction force on the basis of imaging-related information during operation on the operation unit.

(2)

The imaging device according to (1) described above, in which the operation unit instructs the imaging device to start image capture, and is further provided with a position detection unit that detects an amount of operation with respect to the operation direction of the operation unit, and the control unit sets the reaction force according to the amount of operation.

(3)

The imaging device according to (2) described above, in which the control unit detects, on the basis of the amount of operation detected by the position detection unit, at least any one of an operation start state indicating a start of operation on the operation unit, a half-push state in which control for an optical system of the imaging device is started, or a full-push state in which shutter control for an imaging element of the imaging device is started, and sets the reaction force according to a result of the detection.

(4)

The imaging device according to any one of (1) to (3) described above, further including a drive circuit that supplies current or voltage to the reaction force generating unit on the basis of the reaction force set by the control unit.

(5)

The imaging device according to (4) described above, in which the reaction force generating unit includes a coil and a magnet, and generates the reaction force by an attractive force or a repulsive force with the magnet according to an electromagnetic force generated due to supply of current or voltage to the coil.

(6)

The imaging device according to (4) described above, in which the reaction force generating unit includes a coil and a magnetically variable elastic body, and generates the reaction force by a variation in elastic modulus of the magnetically variable elastic body according to a magnetic field that varies due to supply of current or voltage to the coil.

(7)

The imaging device according to (3) described above, in which the imaging-related information is at least one of imaging operation possibility information, captured image information, or imaging mode information.

(8)

The imaging device according to (7) described above, in which the imaging operation possibility information is information indicating at least one of a remaining storage capacity of a storage medium provided in the imaging device or a remaining capacity of a power supply for operating the imaging device, and the control unit sets the reaction force when a condition that the imaging operation possibility information is equal to or less than a predetermined threshold is satisfied.

(9)

The imaging device according to (8) described above, in which when the condition that the remaining capacity of the power supply is equal to or less than a predetermined threshold is satisfied, the control unit sets a reaction force stronger than a reaction force when the condition is not satisfied.

(10)

The imaging device according to (8) described above, in which when the full-push state is detected and the condition that the remaining storage capacity is equal to or less than a predetermined value is satisfied, the control unit sets a reaction force stronger than a reaction force when the condition is not satisfied.

(11)

The imaging device according to (7) described above, in which the captured image information is information indicating at least one of composition information regarding a composition of a captured image or a degree of focus on a subject in the captured image, and the control unit sets the reaction force when the captured image information satisfies a predetermined condition.

(12)

The imaging device according to (11) described above, in which when the half-push state is detected and the composition information regarding the composition of the captured image satisfies a predetermined condition, the control unit sets a reaction force stronger than a reaction force when the composition information does not satisfy the predetermined condition.

(13)

The imaging device according to (11) described above, in which the control unit sets the reaction force according to the degree of focus when detecting the half-push state.

(14)

The imaging device according to (7) described above, in which the imaging mode information is information indicating at least one of a moving image mode, a continuous image capture mode, an electronic shutter mode in which the imaging element performs image capture by an electronic shutter, or an erroneous operation prevention mode for preventing an erroneous operation of the imaging device, during operation of the imaging device, and the control unit sets the reaction force according to the imaging mode information.

(15)

The imaging device according to (14) described above, in which
the reaction force generating unit includes a piezoelectric element, and
the control unit sets the reaction force so that vibration is applied to the reaction force generating unit, when the imaging mode information indicates the electronic shutter mode and the full-push state is detected.

(16)

The imaging device according to (14) described above, in which
the control unit determines that an abnormal operation occurs when an operation speed to the operation unit based on the amount of operation is equal to or greater than a predetermined threshold, and
when the imaging mode information indicates the erroneous operation prevention mode and an occurrence of the abnormal operation is detected,
the control unit sets a reaction force stronger than a reaction force when the occurrence of the abnormal operation is not detected, and
inhibits the control for the optical system of the imaging device and the shutter control for the imaging element.

(17)

The imaging device according to any one of (2) to (16) described above, further including:
a profile storage unit that holds a profile indicating a reaction force set by the control unit on the basis of the imaging-related information and the amount of operation; and
a setting input unit capable of freely setting the imaging-related information, the amount of operation, and a reaction force to be set which are indicated in the profile.

(18)

The imaging device according to (17) described above, in which
the setting input unit is capable of freely setting a detection position at which the control unit detects a predetermined state with respect to the amount of operation and a number of the predetermined states.

(19)

An imaging operation device including:
a communication unit that communicates with an imaging device by wire or wirelessly;
an operation unit that controls an imaging operation of the imaging device via the communication unit;
a reaction force generating unit that generates a reaction force with respect to an operation direction of the operation unit; and
a control unit that sets the reaction force on the basis of imaging-related information of the imaging device during operation on the operation unit.

(20)

A control method of an imaging device including:
generating a reaction force with respect to an operation direction of an operation unit; and
setting the reaction force on the basis of imaging-related information during operation on the operation unit.

It should be noted that the embodiments of the present disclosure are not limited to the abovementioned embodiments, and various modifications can be made without departing from the gist of the present disclosure. In addition, the effects described in the present specification are merely illustrative and not restrictive, and may have additional effects.

REFERENCE SIGNS LIST

11 Imaging device
12 Imaging unit
13 Camera body
14 Shutter operation unit
15 External storage memory
16 Power supply
17 Display unit
18 Setting input unit
21 Housing
22 Release cover
23 Release shaft
24 Compression coil spring
25 Coil
26 Magnet
27 Magnetically variable elastic body
28 Piezoelectric element
29 Elastic body
30 Coil
31 Magnet
32 Compression coil spring
33 Magnet
41 Detection plate
42 Detection substrate
43 Elastic body
44 Detection electrode
45 Pressure sensor
46 and 47 Photo reflector
48 Reflectance change sheet
49 Plate-shaped elastic body
50 Frame
51 Strain sensor
61 Optical system
62 Imaging element
71 A/D conversion unit
72 Signal processing unit
73 Optical system control unit
74 Shutter control unit
75 Face recognition processing unit
76 Angular velocity sensor
77 Buffer memory
78 Power supply circuit
79 Drive circuit
80 Detection circuit
81 Profile storage unit
82 Profile setting unit
83 CPU
91 Reaction force generating unit
92 Position detection unit

The invention claimed is:

1. An imaging device, comprising:
an operation member;
a reaction force generating unit configured to generate a reaction force with respect to an operation direction of the operation member; and
control circuitry configured to set a value of the reaction force based on imaging-related information, during operation on the operation member, wherein the imaging-related information is at least one of imaging operation possibility information, captured image information, or it aging mode information.

2. The imaging device according to claim 1, wherein
the operation of the operation member instructs the imaging device to start image capture, and the operation member is further provided with a position detector that detects an amount of operation with respect to the operation direction of the operation member; and the control circuitry is further configured to set the reaction force according to the amount of operation.

3. The imaging device according to claim 2, wherein the control circuitry is further configured to detect, based on the amount of operation detected by the position detector, at least one of an operation start state indicating a start of operation on the operation member, a half-push state in which control for an optical system of the imaging device is started, or a full-push state in which shutter control for an imaging element of the imaging device is started, and set the reaction force according to a result of the detection.

4. The imaging device according to claim 1, further comprising a drive circuit configured to supply current or voltage to the reaction force generating unit based on the reaction force set by the control circuitry.

5. The imaging device according to claim 4, wherein the reaction force generating unit includes a coil and a magnet, and is further configured to generate the reaction force by an attractive force or a repulsive force with the magnet according to an electromagnetic force generated due to supply of current or voltage to the coil.

6. The imaging device according to claim 4, wherein the reaction force generating unit includes a coil and a magnetically variable elastic body, and is further configured to generate the reaction force by a variation in elastic modulus of the magnetically variable elastic body according to a magnetic field that varies due to supply of current or voltage to the coil.

7. The imaging device according to claim 3, wherein the imaging operation possibility information is information indicating at least one of a remaining storage capacity of a storage medium provided in the imaging device or a remaining capacity of a power supply for operating the imaging device, and the control circuitry is further configured to set the reaction force when a condition that the imaging operation possibility information is equal to or less than a predetermined threshold is satisfied.

8. The imaging device according to claim 7, wherein when the condition that the remaining capacity of the power supply is equal to or less than a predetermined threshold is satisfied, the control circuitry is further configured to set a reaction force stronger than a reaction force when the condition is not satisfied.

9. The imaging device according to claim 7, wherein when the full-push state is detected and the condition that the remaining storage capacity is equal to or less than a predetermined value is satisfied, the control circuitry is further configured to set a reaction force stronger than a reaction force when the condition is not satisfied.

10. The imaging device according to claim 3, wherein the captured image information is information indicating at least one of composition information regarding a composition of a captured image or a degree of focus on a subject in the captured image, and the control circuitry is further configured to set the reaction force when the captured image information satisfies a predetermined condition.

11. The imaging device according to claim 10, wherein when the half-push state is detected and the composition information regarding the composition of the captured image satisfies a predetermined condition, the control circuitry is further configured to set a reaction force stronger than a reaction force when the composition information does not satisfy the predetermined condition.

12. The imaging device according to claim 10, wherein the control circuitry is further configured to set the reaction force according to the degree of focus when detecting the half-push state.

13. The imaging device according to claim 3, wherein the imaging mode information is information indicating at least one of a moving image mode, a continuous image capture mode, an electronic shutter mode in which the imaging element performs image capture by an electronic shutter, or an erroneous operation prevention mode for preventing an erroneous operation of the imaging device, during operation of the imaging device, and the control circuitry is further configured to set the reaction force according to the imaging mode information.

14. The imaging device according to claim 13, wherein the reaction force generating unit includes a piezoelectric element, and the control circuitry is further configured to set the reaction force so that a vibration is applied to the reaction force generating unit, when the imaging mode information indicates the electronic shutter mode and the full-push state is detected.

15. The imaging device according to claim 13, wherein the control circuitry is further configured to determine that an abnormal operation occurs when an operation speed to the operation member based on the amount of operation is equal to or greater than a predetermined threshold, and when the imaging mode information indicates the erroneous operation prevention mode and an occurrence of the abnormal operation is detected, the control circuitry is further configured to set a reaction force stronger a reaction force when the occurrence of the abnormal operation is not detected, and inhibit the control for the optical system of the imaging device and the shutter control for the imaging element.

16. The imaging device according to claim 2, further comprising:

a profile memory that holds a profile indicating the value of the reaction force set by the control circuitry based, on the imaging-related information and the amount of operation; and a setting interface configured to freely set the imaging-related information, the amount of operation, and the value of the reaction force, which are indicated in the profile.

17. The imaging device according to claim 16, wherein the setting interface is further configured to freely set a detection position at which the control circuitry detects a predetermined state with respect to the amount of operation and a number of the predetermined states.

18. An imaging operation device, comprising:

a communication interface that communicates with an imaging device by wire or wirelessly;

an operation member that, when operated, controls an imaging operation of the imaging device via the communication interface;

a reaction force generating unit configured to generate a reaction force with respect to an operation direction of the operation member; and control circuitry configured to set a value of the reaction force based on imaging-related information of the imaging device, during operation on the operation member, wherein the imaging-related information is at least one of imaging operation possibility information, captured image information, or imaging mode information.

19. A control method of an imaging device, the control method comprising:
generating a reaction force with respect to an operation direction of an operation member; and
setting a value of the reaction force based on imaging-related information, during operation on the operation member, wherein the imaging-related information is at least one of imaging operation possibility information, captured image information, or imaging mode information.

* * * * *